United States Patent
Lee et al.

(10) Patent No.: US 11,133,229 B2
(45) Date of Patent: *Sep. 28, 2021

(54) FORMING TRANSISTOR BY SELECTIVELY GROWING GATE SPACER

(71) Applicant: Taiwan Semiconductor Manufacturing Company, Ltd., Hsinchu (TW)

(72) Inventors: Kai-Hsuan Lee, Hsinchu (TW); Chia-Ta Yu, New Taipei (TW); Cheng-Yu Yang, Xihu Township (TW); Sheng-Chen Wang, Hsinchu (TW); Bo-Yu Lai, Taipei (TW); Bo-Cyuan Lu, New Taipei (TW); Chi On Chui, Hsinchu (TW); Sai-Hooi Yeong, Zhubei (TW); Feng-Cheng Yang, Zhudong Township (TW); Yen-Ming Chen, Chu-Pei (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 16/740,895

(22) Filed: Jan. 13, 2020

(65) Prior Publication Data

US 2020/0152522 A1 May 14, 2020

Related U.S. Application Data

(63) Continuation of application No. 16/048,483, filed on Jul. 30, 2018, now Pat. No. 10,535,569, which is a
(Continued)

(51) Int. Cl.
| | |
|---|---|
| *H01L 21/8238* | (2006.01) |
| *H01L 27/092* | (2006.01) |
| *H01L 29/49* | (2006.01) |
| *H01L 29/08* | (2006.01) |
| *H01L 21/8234* | (2006.01) |

(Continued)

(52) U.S. Cl.
CPC ........... *H01L 21/823864* (2013.01); *H01L 21/823431* (2013.01); *H01L 21/823814* (2013.01);
(Continued)

(58) Field of Classification Search
CPC ..... H01L 21/823864; H01L 21/823431; H01L 29/66795; H01L 21/823821;
(Continued)

(56) References Cited

U.S. PATENT DOCUMENTS

| | | | |
|---|---|---|---|
| 8,900,961 B2 | 12/2014 | Chakravarti et al. | |
| 9,659,942 B1 | 5/2017 | Basker et al. | |

(Continued)

FOREIGN PATENT DOCUMENTS

| | | |
|---|---|---|
| CN | 1933175 A | 3/2007 |
| CN | 106373997 A | 2/2017 |

(Continued)

*Primary Examiner* — Mohammed R Alam
(74) *Attorney, Agent, or Firm* — Slater Matsil, LLP

(57) ABSTRACT

A method includes forming a gate dielectric layer on a semiconductor fin, and forming a gate electrode over the gate dielectric layer. The gate electrode extends on sidewalls and a top surface of the semiconductor fin. A gate spacer is selectively deposited on a sidewall of the gate electrode. An exposed portion of the gate dielectric layer is free from a same material for forming the gate spacer deposited thereon. The method further includes etching the gate dielectric layer using the gate spacer as an etching mask to expose a portion of the semiconductor fin, and forming an epitaxy semiconductor region based on the semiconductor fin.

20 Claims, 21 Drawing Sheets

Related U.S. Application Data continuation of application No. 15/491,384, filed on Apr. 19, 2017, now Pat. No. 10,037,923.

(51) Int. Cl.
  *H01L 29/66* (2006.01)
(52) U.S. Cl.
  CPC .. *H01L 21/823821* (2013.01); *H01L 27/0924* (2013.01); *H01L 29/0847* (2013.01); *H01L 29/4983* (2013.01); *H01L 29/66795* (2013.01); *H01L 21/823418* (2013.01); *H01L 21/823468* (2013.01)
(58) Field of Classification Search
  CPC ......... H01L 21/823814; H01L 27/0924; H01L 29/4983; H01L 29/0847; H01L 21/823418; H01L 21/823468; H01L 29/785; H01L 21/0337; H01L 29/6653; H01L 29/6656
  See application file for complete search history.

(56) References Cited

U.S. PATENT DOCUMENTS

| | | | |
|---|---|---|---|
| 10,037,923 | B1 | 1/2018 | Lee et al. |
| 10,050,147 | B2 | 8/2018 | Liang et al. |
| 2007/0254442 | A1* | 11/2007 | Manger ............... H01L 29/6656 |
| | | | 438/304 |
| 2015/0200271 | A1 | 7/2015 | Lee et al. |
| 2015/0357434 | A1* | 12/2015 | Jang .................... H01L 29/4966 |
| | | | 438/587 |
| 2016/0005656 | A1 | 1/2016 | Ching et al. |
| 2016/0322498 | A1 | 11/2016 | Chang et al. |
| 2017/0117409 | A1* | 4/2017 | Balakrishnan ...... H01L 29/7848 |
| 2017/0062617 | A1 | 5/2017 | Fang et al. |

FOREIGN PATENT DOCUMENTS

| | | |
|---|---|---|
| JP | 2007081361 A | 3/2007 |
| KR | 20170011958 A | 2/2017 |

\* cited by examiner

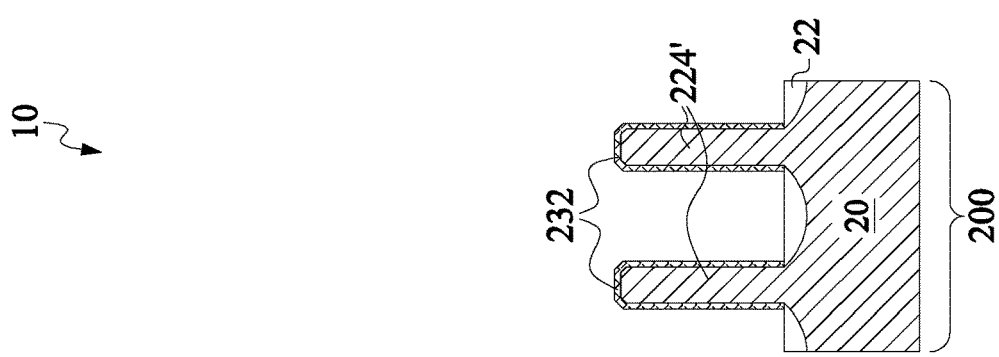
Fig. 4C
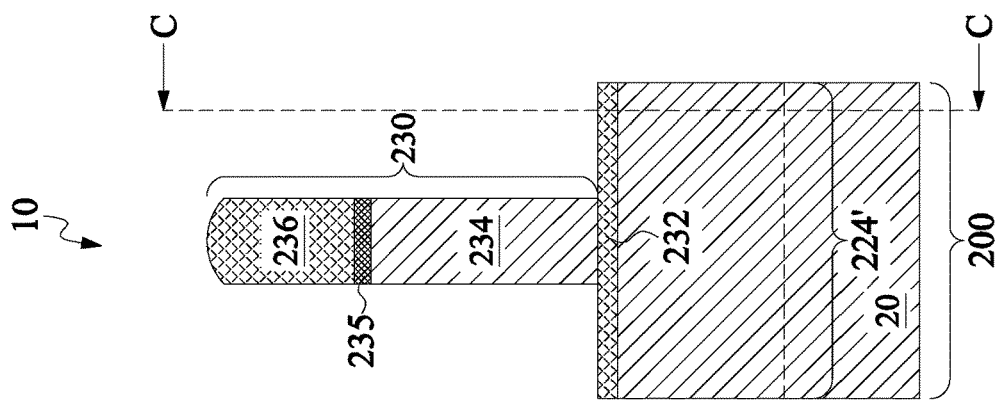
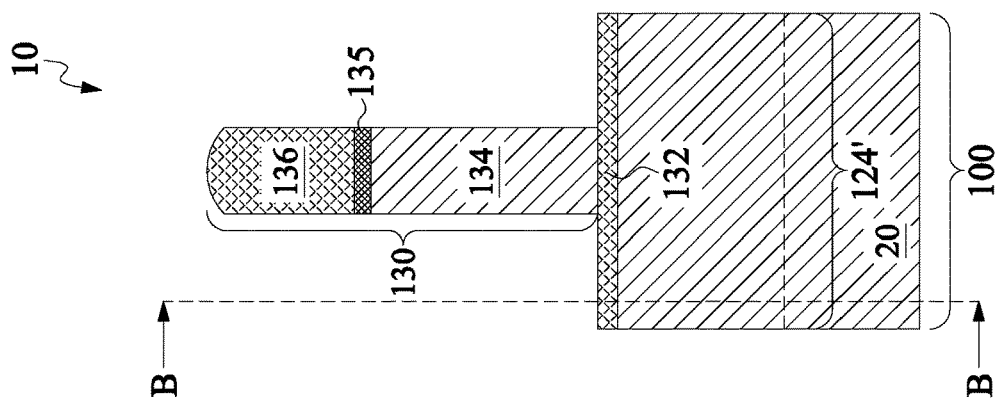
Fig. 4A
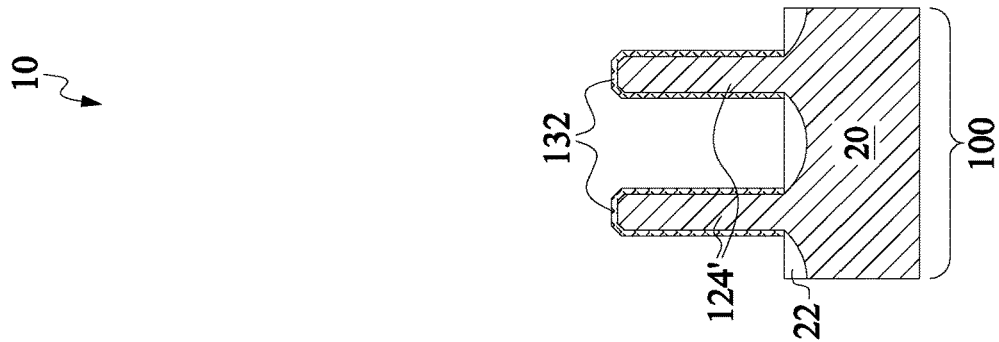
Fig. 4B

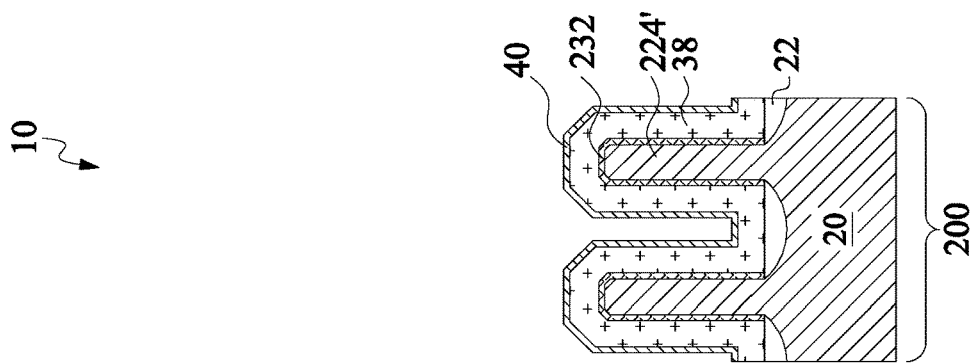
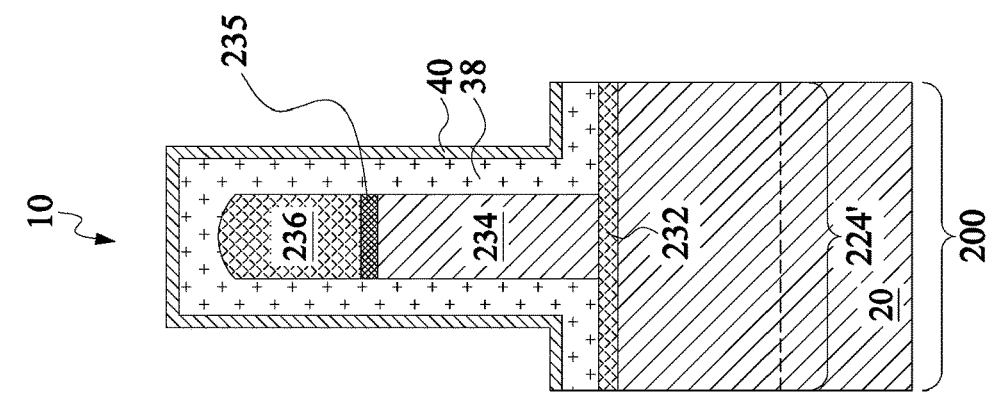
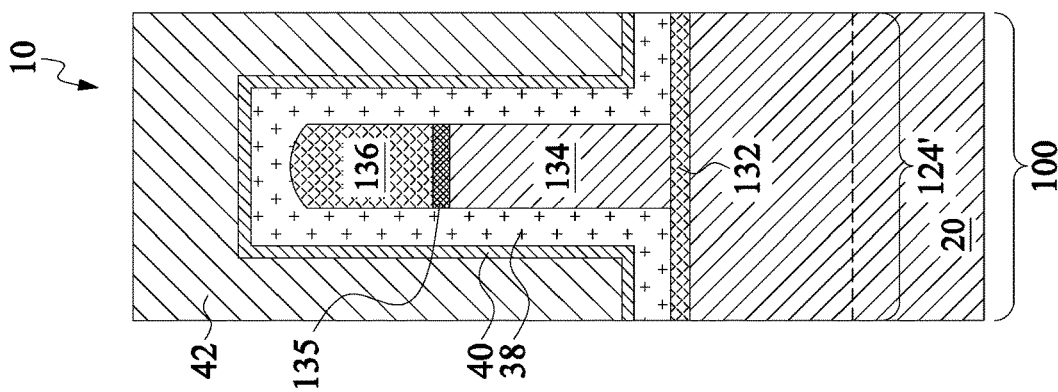
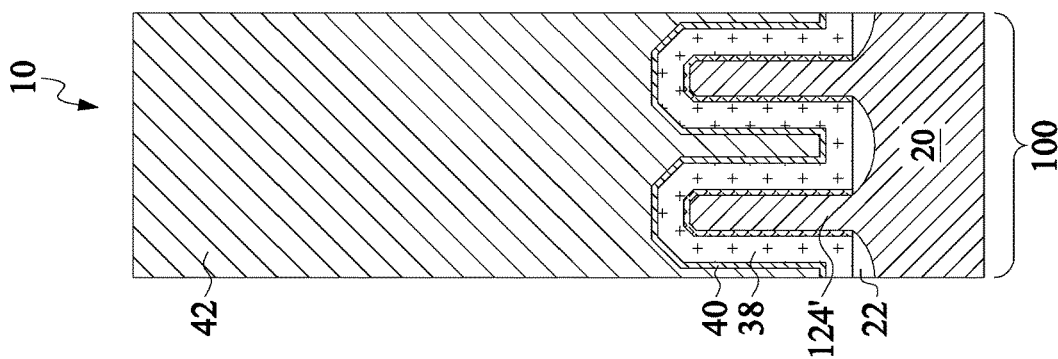
Fig. 5C
Fig. 5A
Fig. 5B

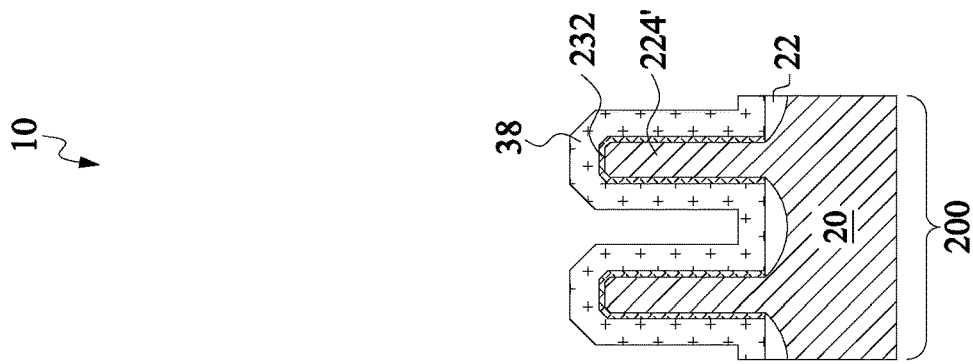
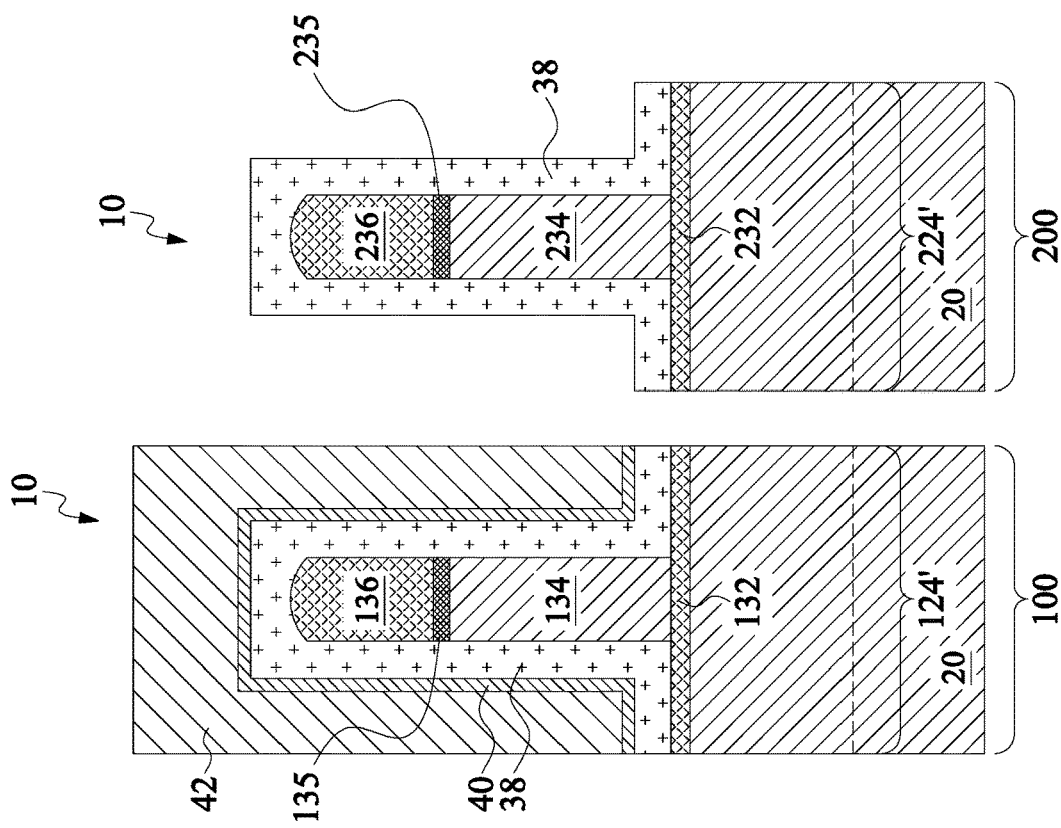
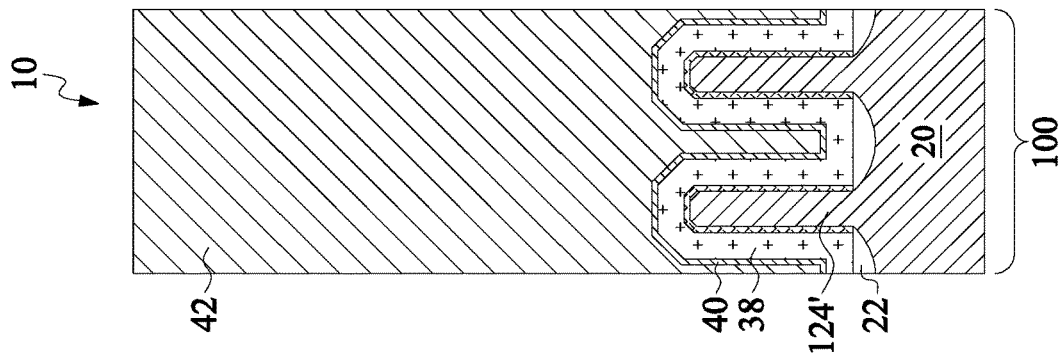
Fig. 6A
Fig. 6B
Fig. 6C

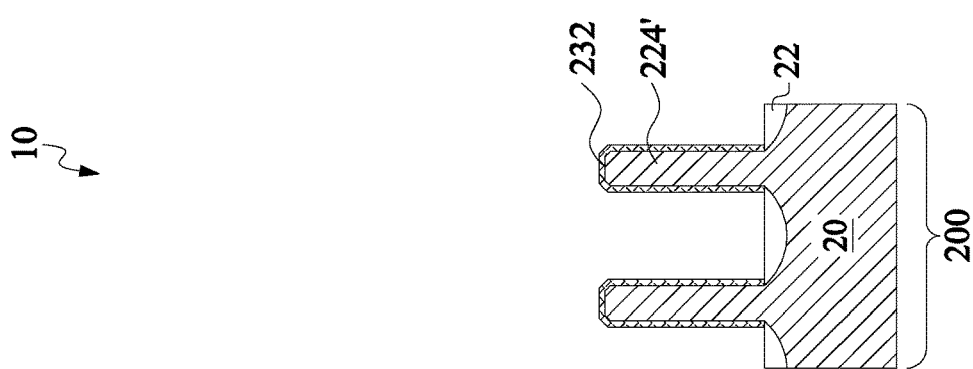
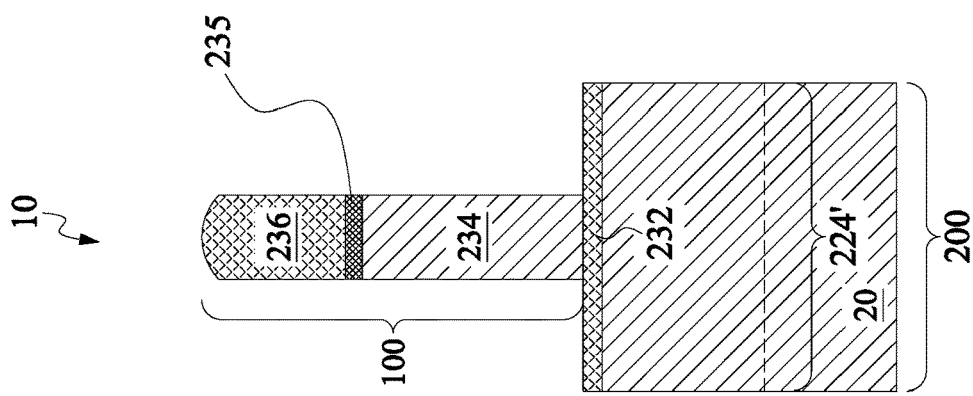
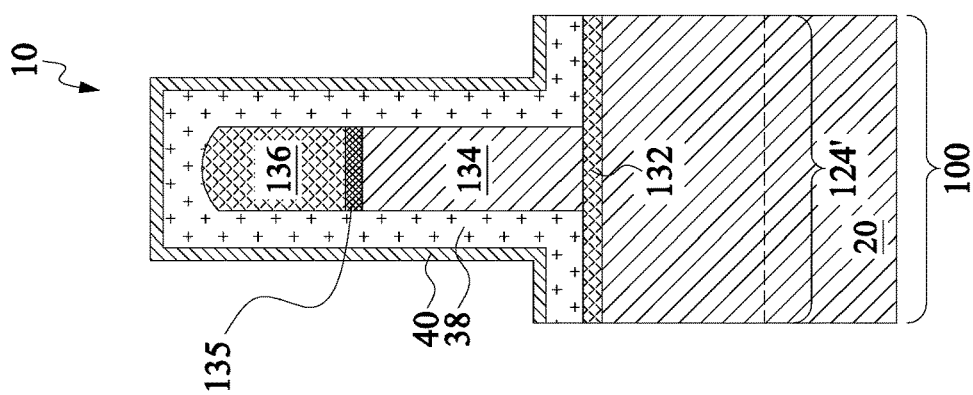
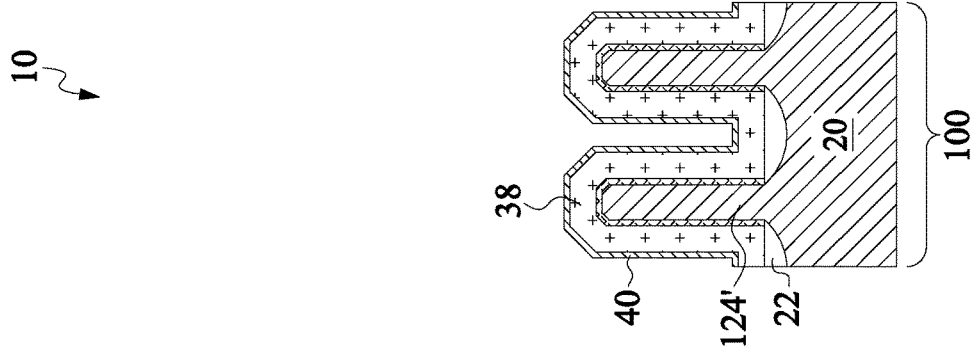
Fig. 8C
Fig. 8A
Fig. 8B

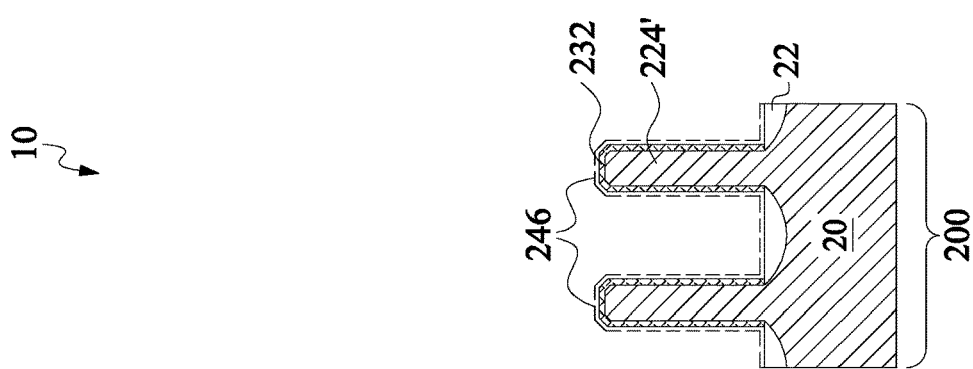
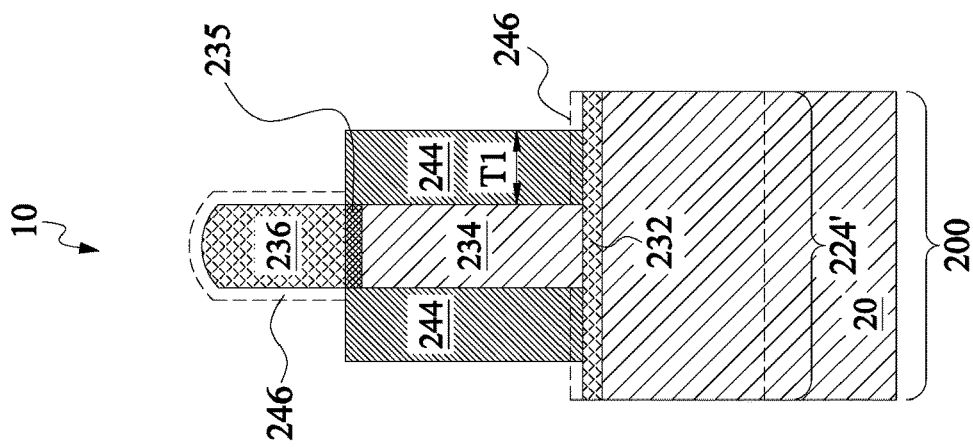
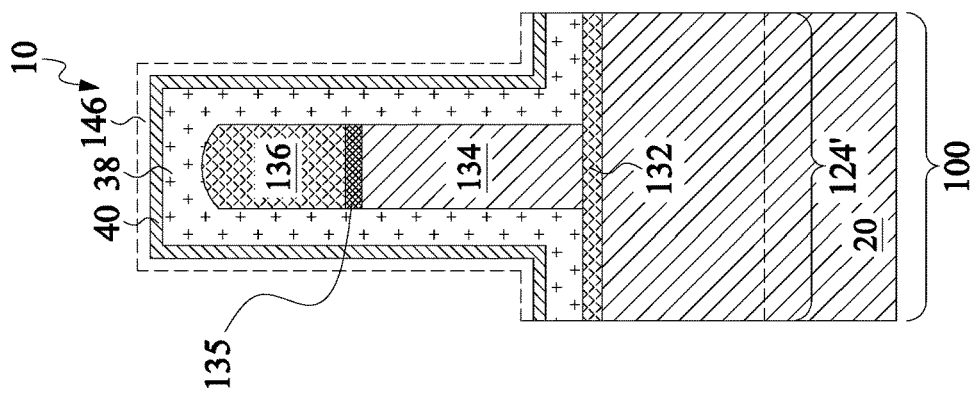
Fig. 9C
Fig. 9A
Fig. 9B

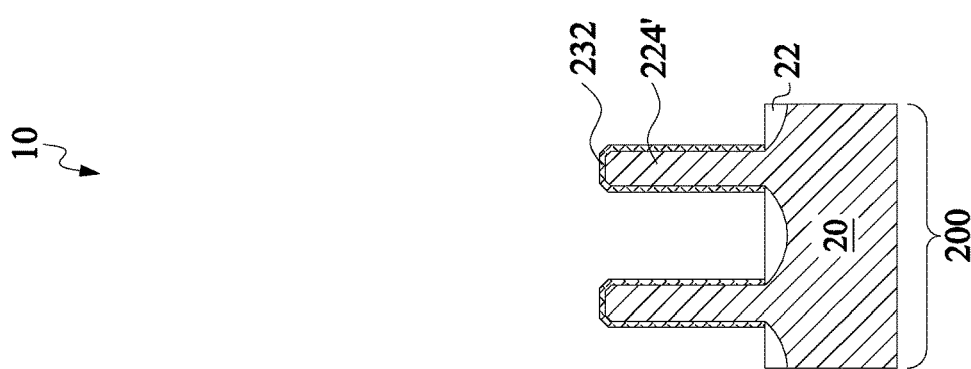
Fig. 10C
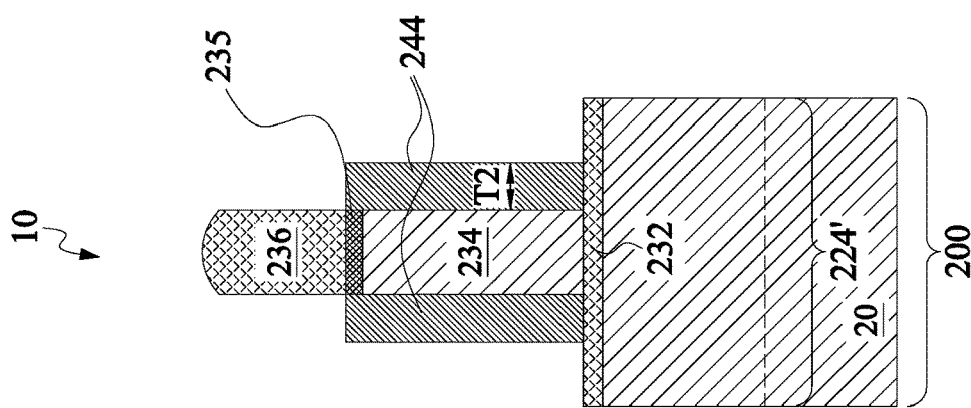
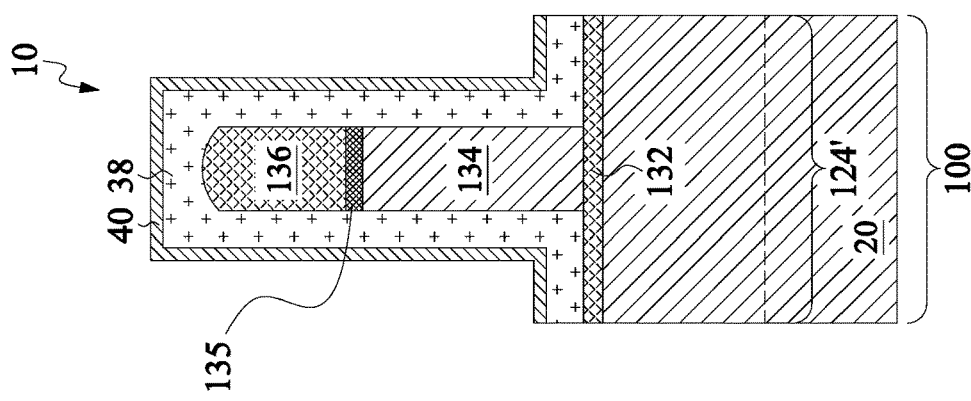
Fig. 10A
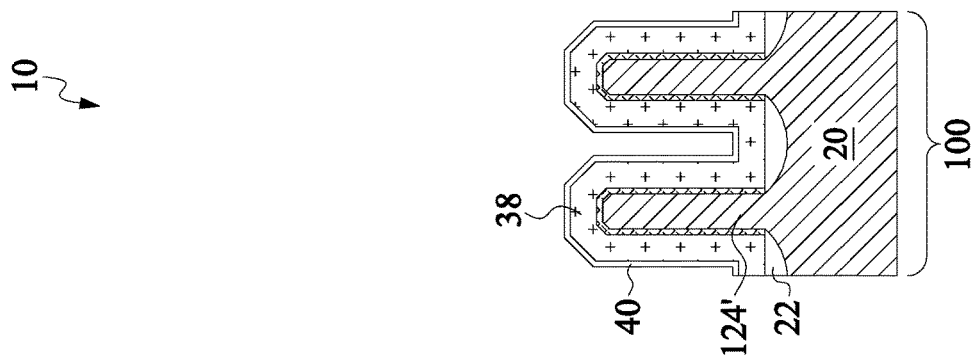
Fig. 10B

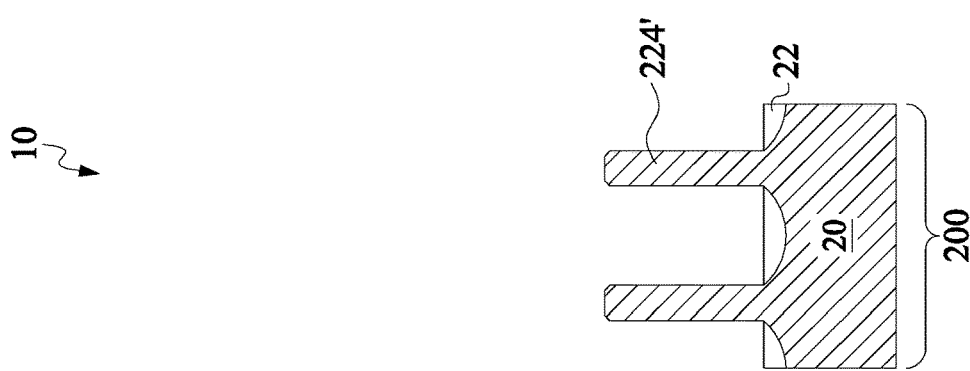
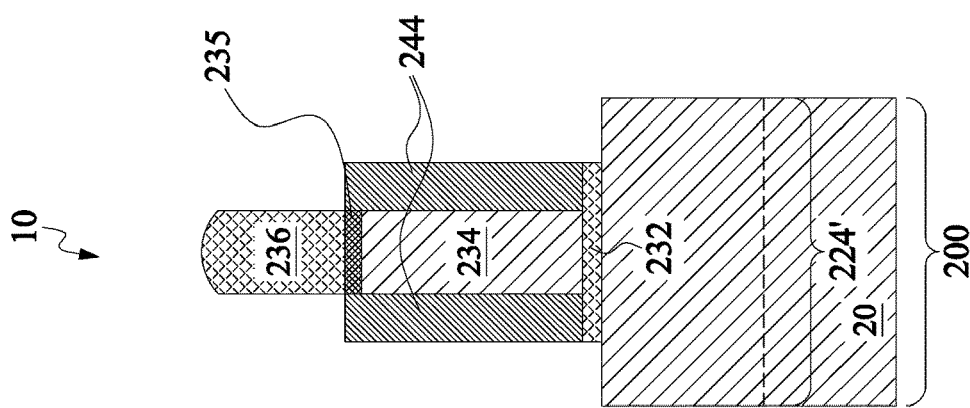
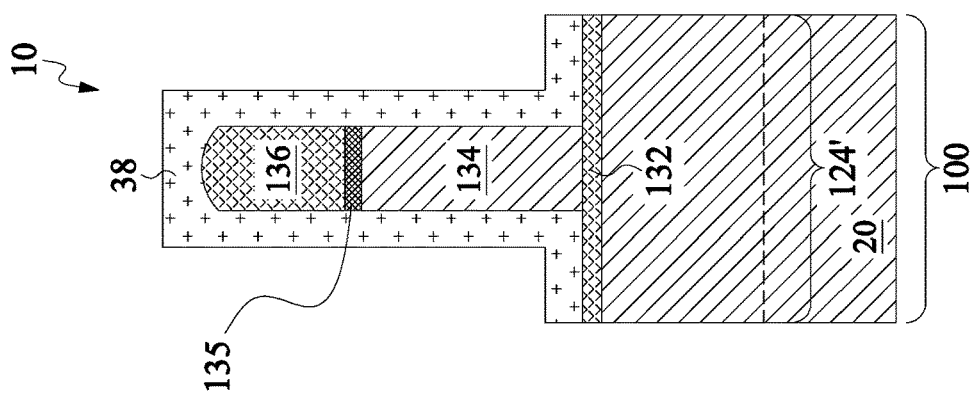
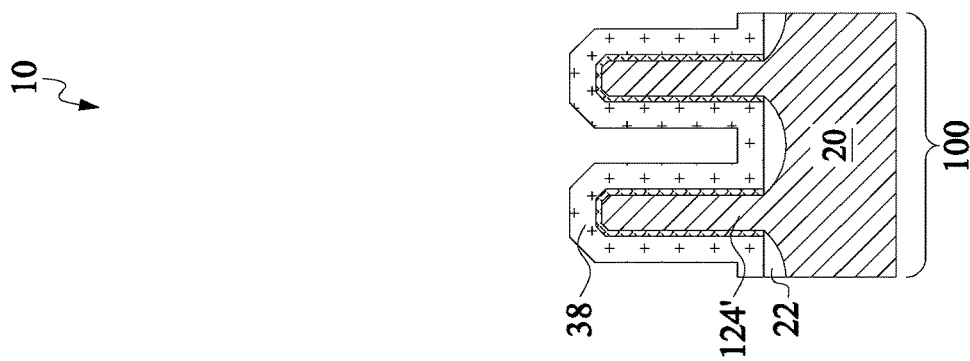
Fig. 11C
Fig. 11A
Fig. 11B

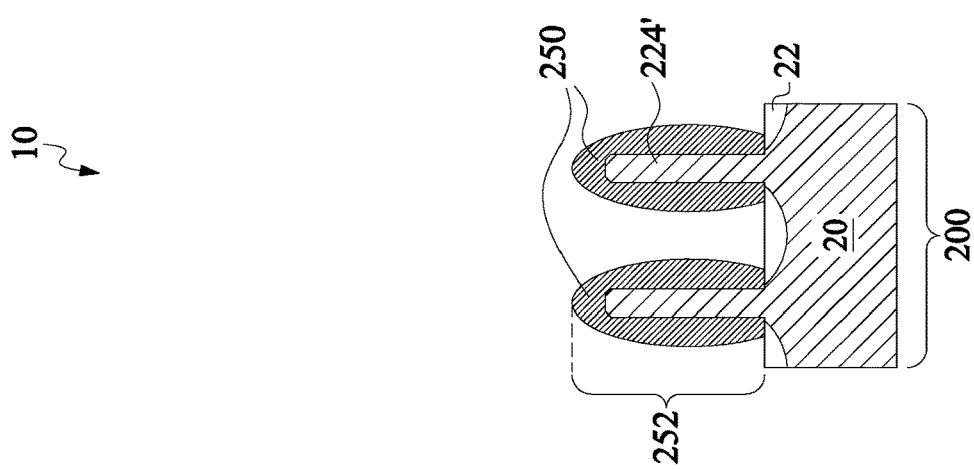
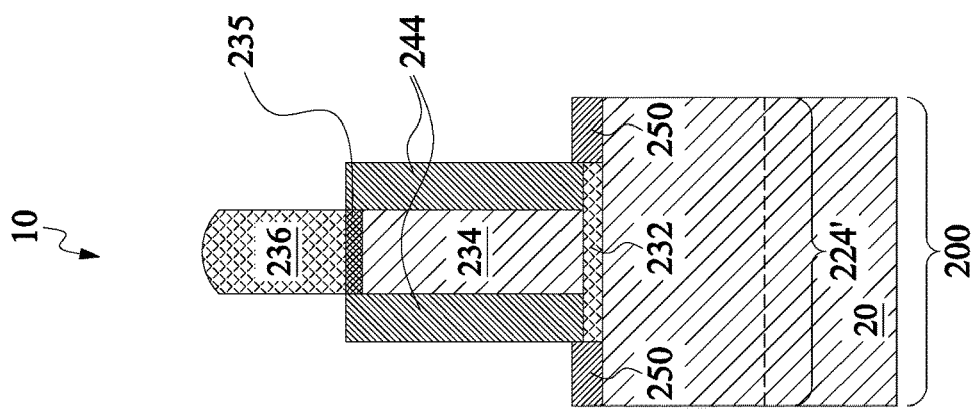
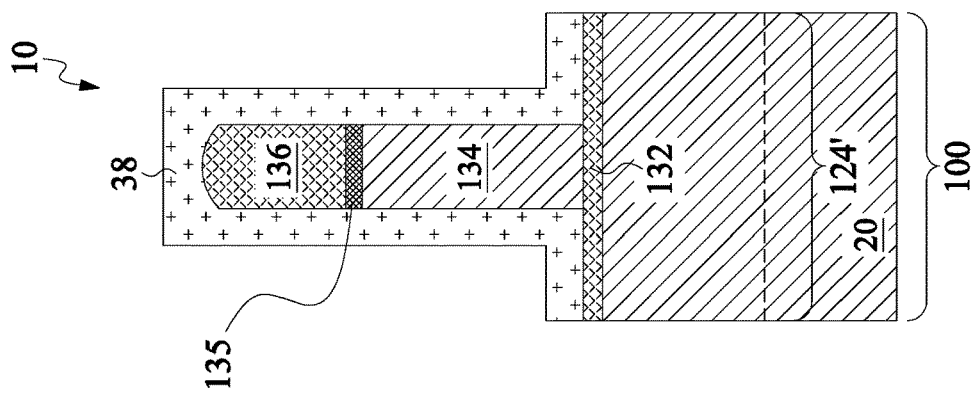
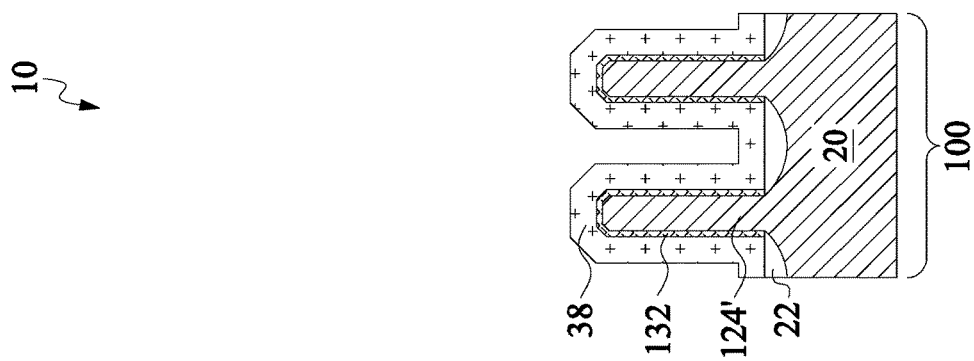
Fig. 12C
Fig. 12A
Fig. 12B

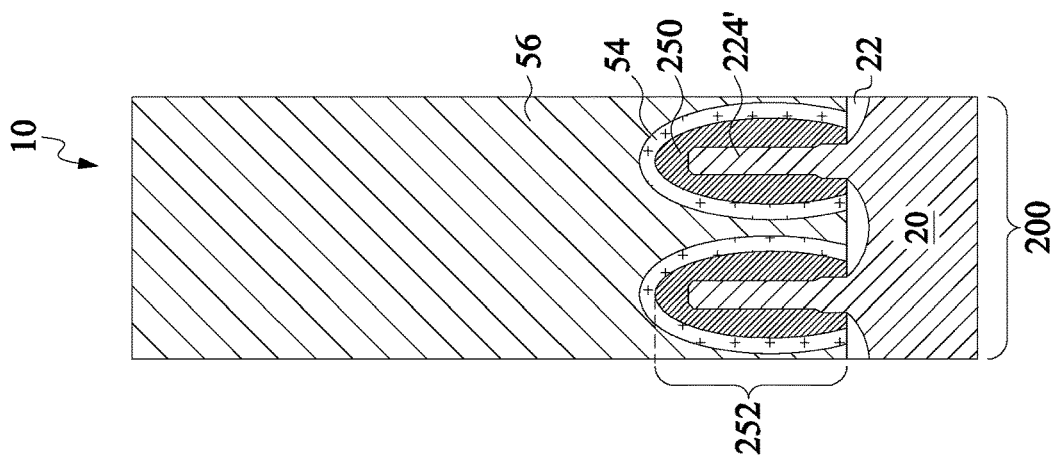
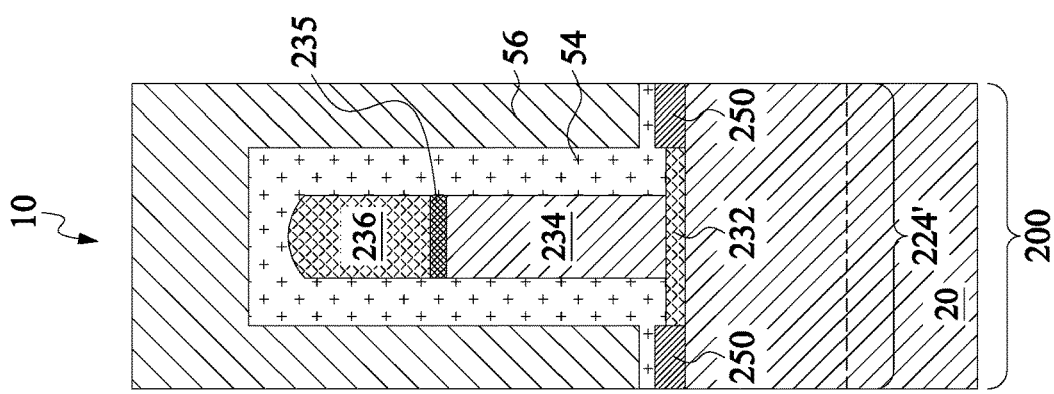
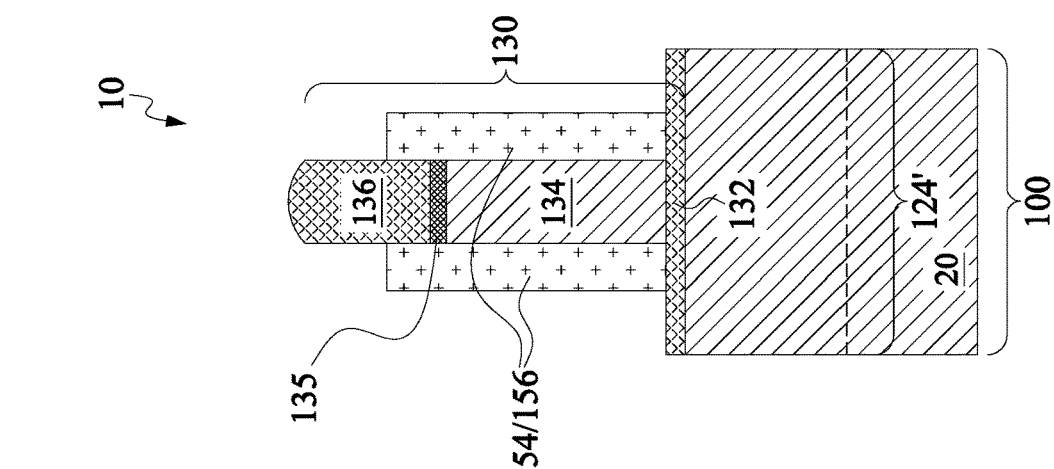
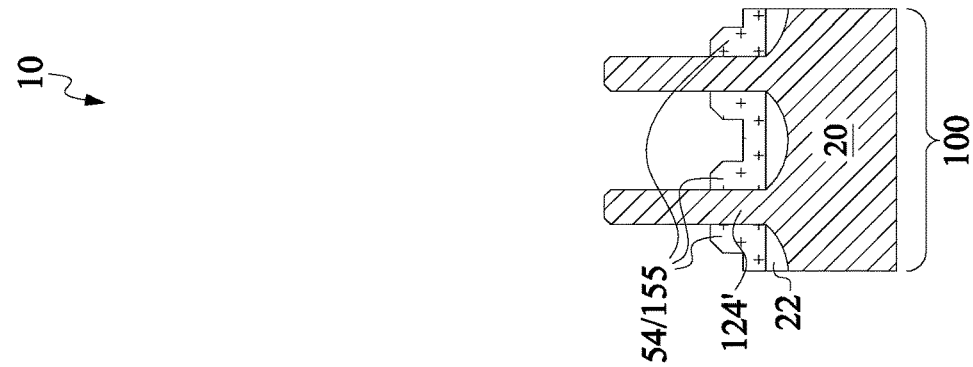
Fig. 14C   Fig. 14A   Fig. 14B

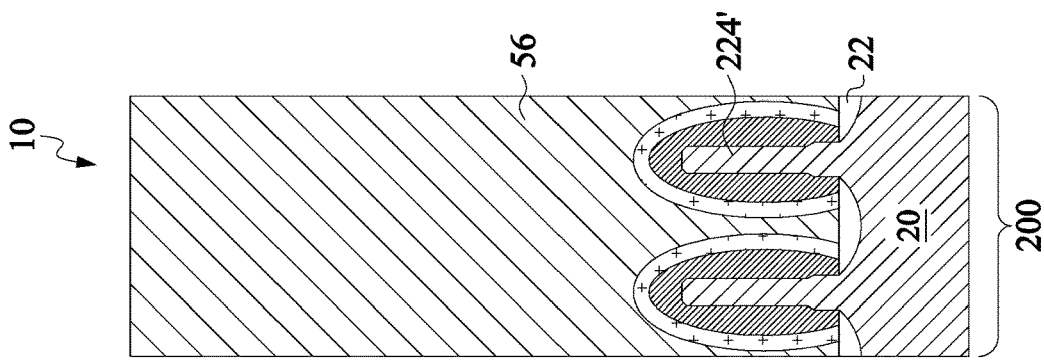
Fig. 15C
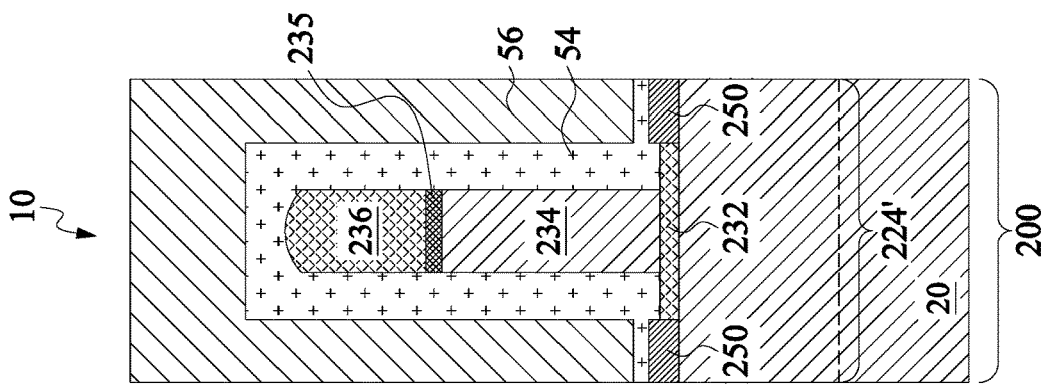
Fig. 15A
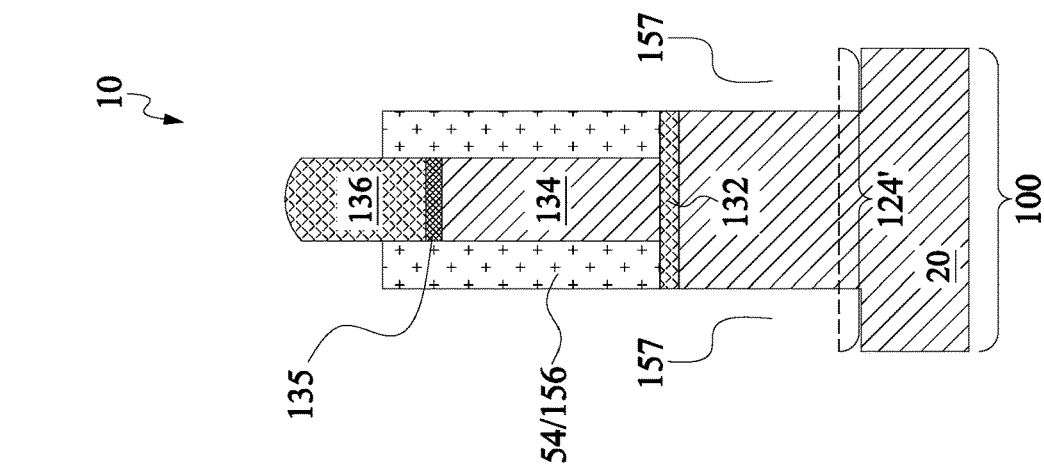
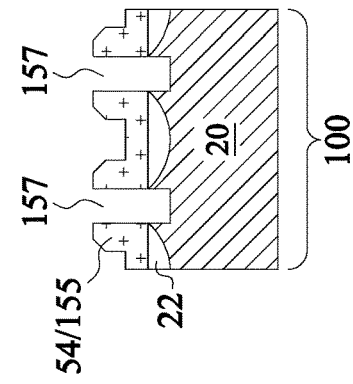
Fig. 15B

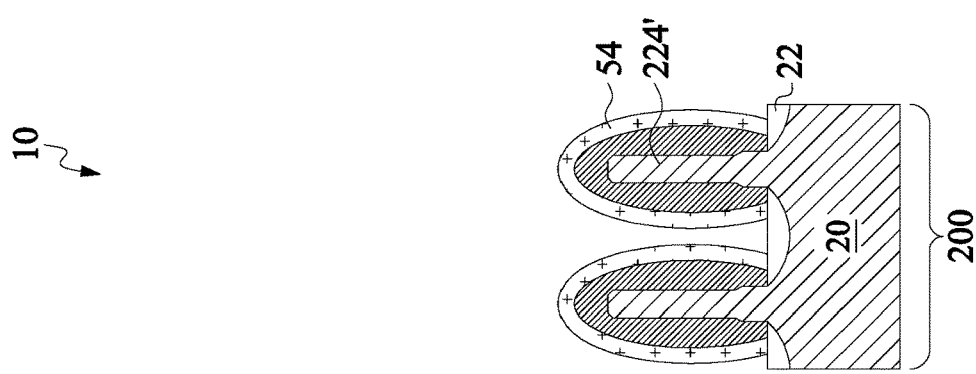
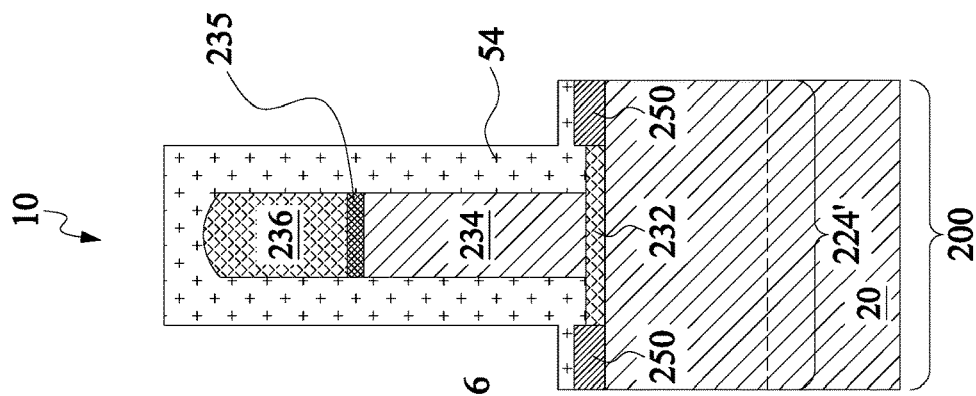
Fig. 16A
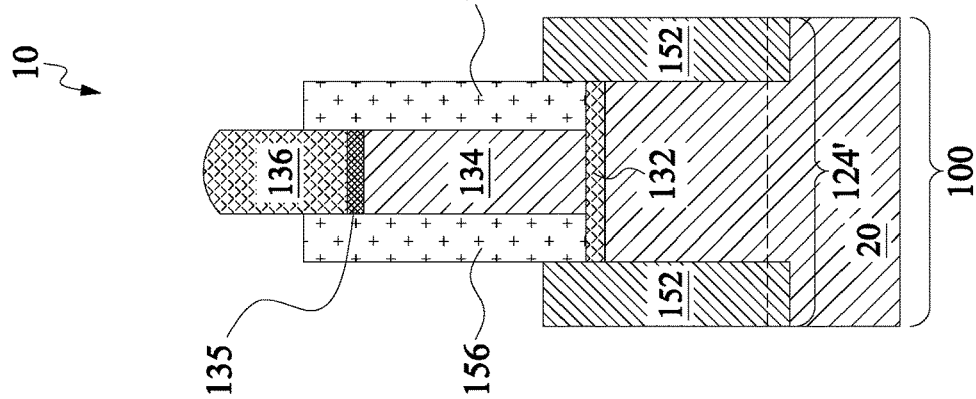
Fig. 16B
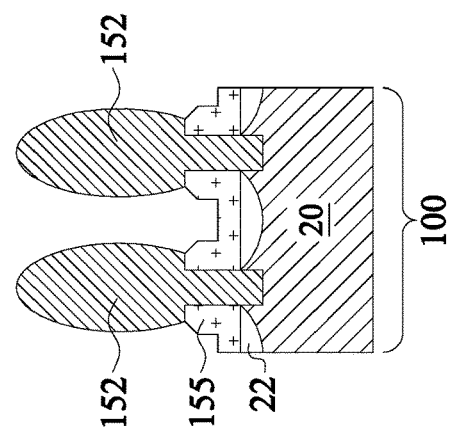
Fig. 16C

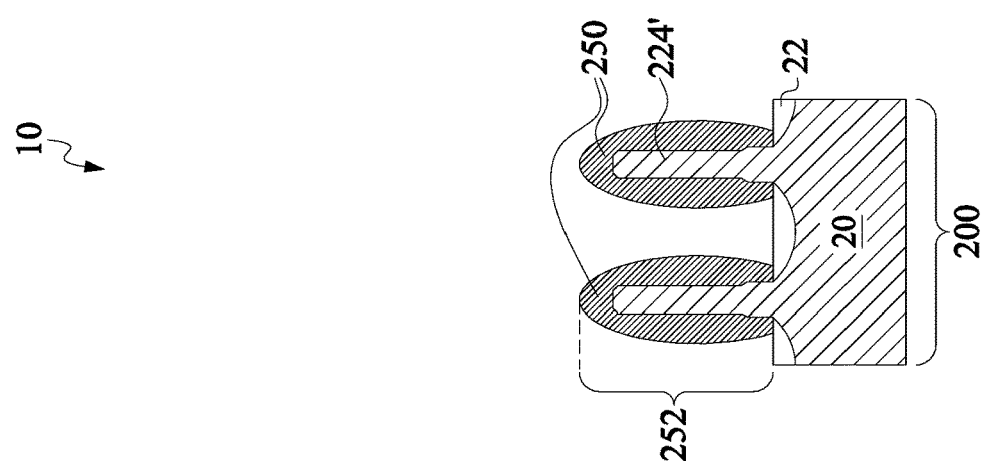
Fig. 17C
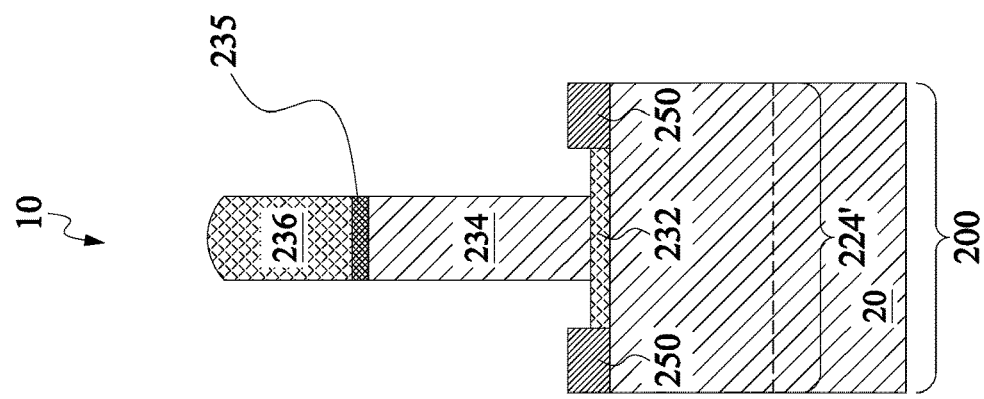
Fig. 17A
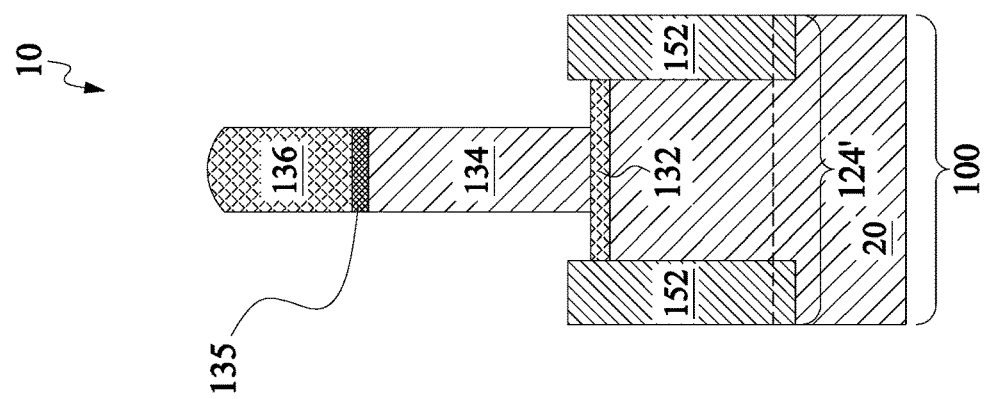
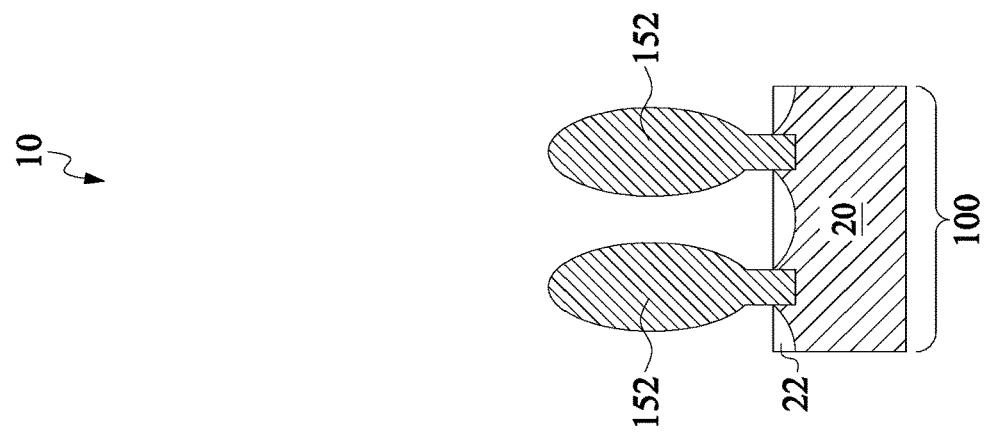
Fig. 17B

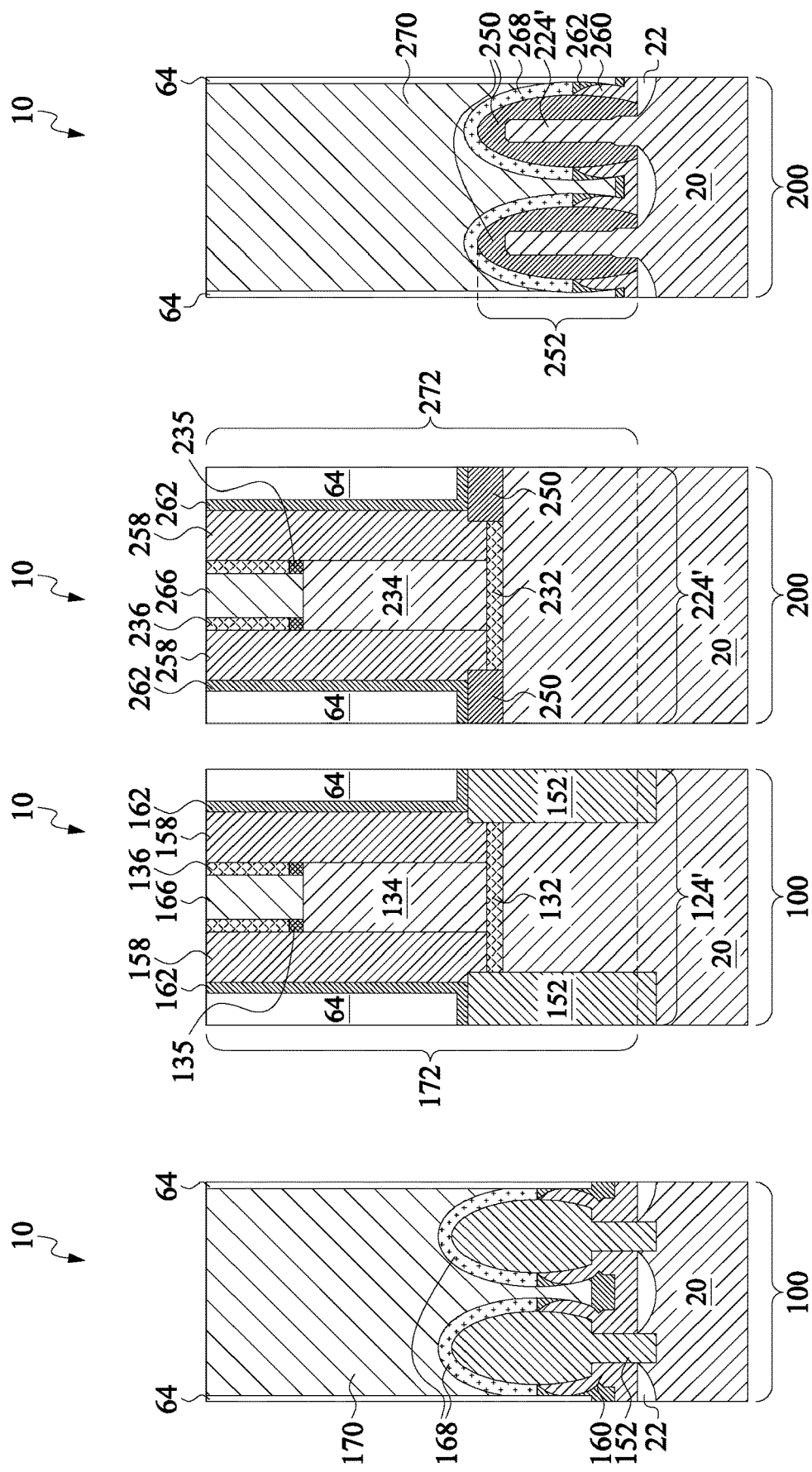

FORMING TRANSISTOR BY SELECTIVELY GROWING GATE SPACER

PRIORITY CLAIM AND CROSS-REFERENCE

This application is a continuation of U.S. patent application Ser. No. 16/048,483, entitled "Forming Transistor by Selectively Growing Gate Spacer," filed Jul. 30, 2018, which is a continuation of U.S. patent application Ser. No. 15/491,384, entitled "Forming Transistor by Selectively Growing Gate Spacer," filed on Apr. 19, 2017, now U.S. Pat. No. 10,037,923 issued Jul. 31, 2018, which applications are incorporated herein by reference.

BACKGROUND

Transistors typically include gate stacks, gate spacers on the sidewalls of the gate stacks, and source and drain regions on the opposite sides of the gate stacks. The formation of the gate spacers typically includes forming a blanket dielectric layer on the top surface and the sidewalls of the gate stacks, and then performing an anisotropic etch to remove the horizontal portions of the blanket dielectric layer. The remaining vertical portions of the blanket dielectric layer are gate spacers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1 through 19A, 19B, and 19C are cross-sectional views and perspective views of intermediate stages in the formation of Fin Field-Effect Transistors (FinFETs) in accordance with some embodiments.

DETAILED DESCRIPTION

Figure 1:
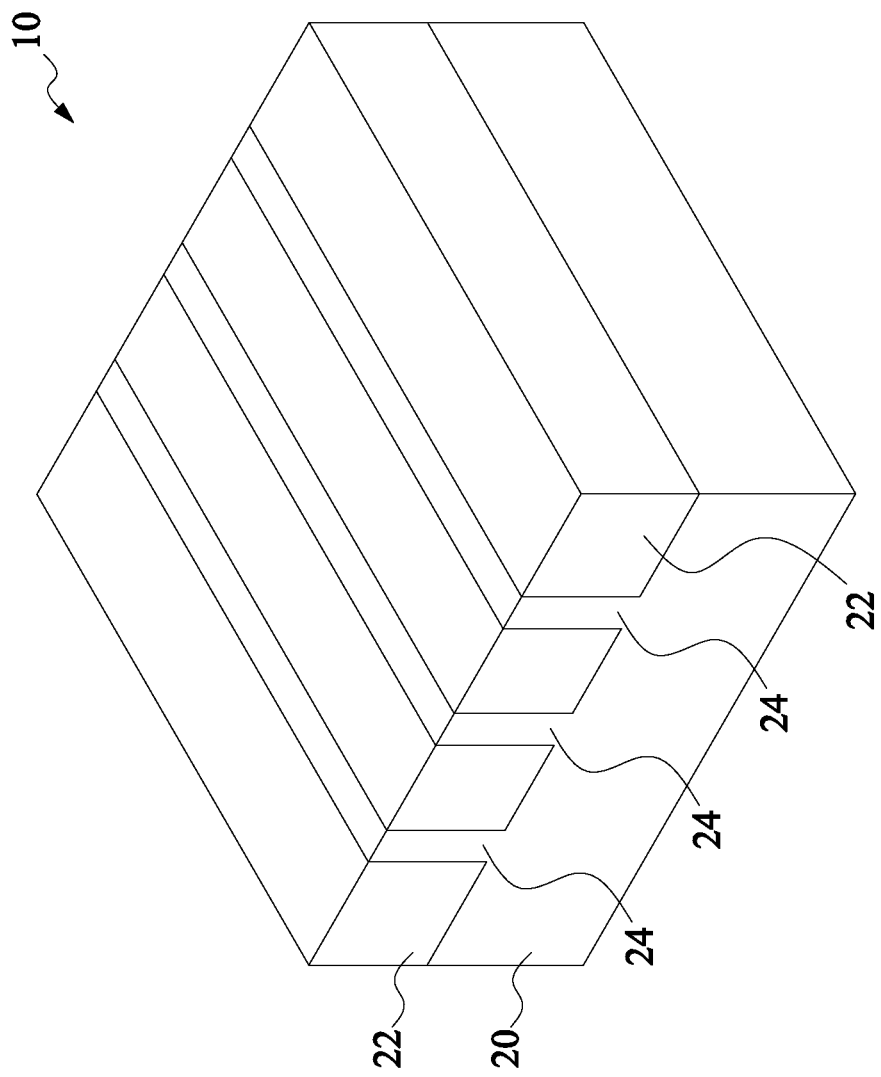

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Transistors and the method of forming the same are provided in accordance with various exemplary embodiments. The intermediate stages of forming the transistors are illustrated in accordance with some embodiments. Some variations of some embodiments are discussed. Throughout the various views and illustrative embodiments, like reference numbers are used to designate like elements. It is appreciated that although the formation of Fin Field-Effect Transistors (FinFETs) is used as exemplary embodiments, the concept of the present disclosure is readily usable on the formation of planar transistors.

Figure 21:
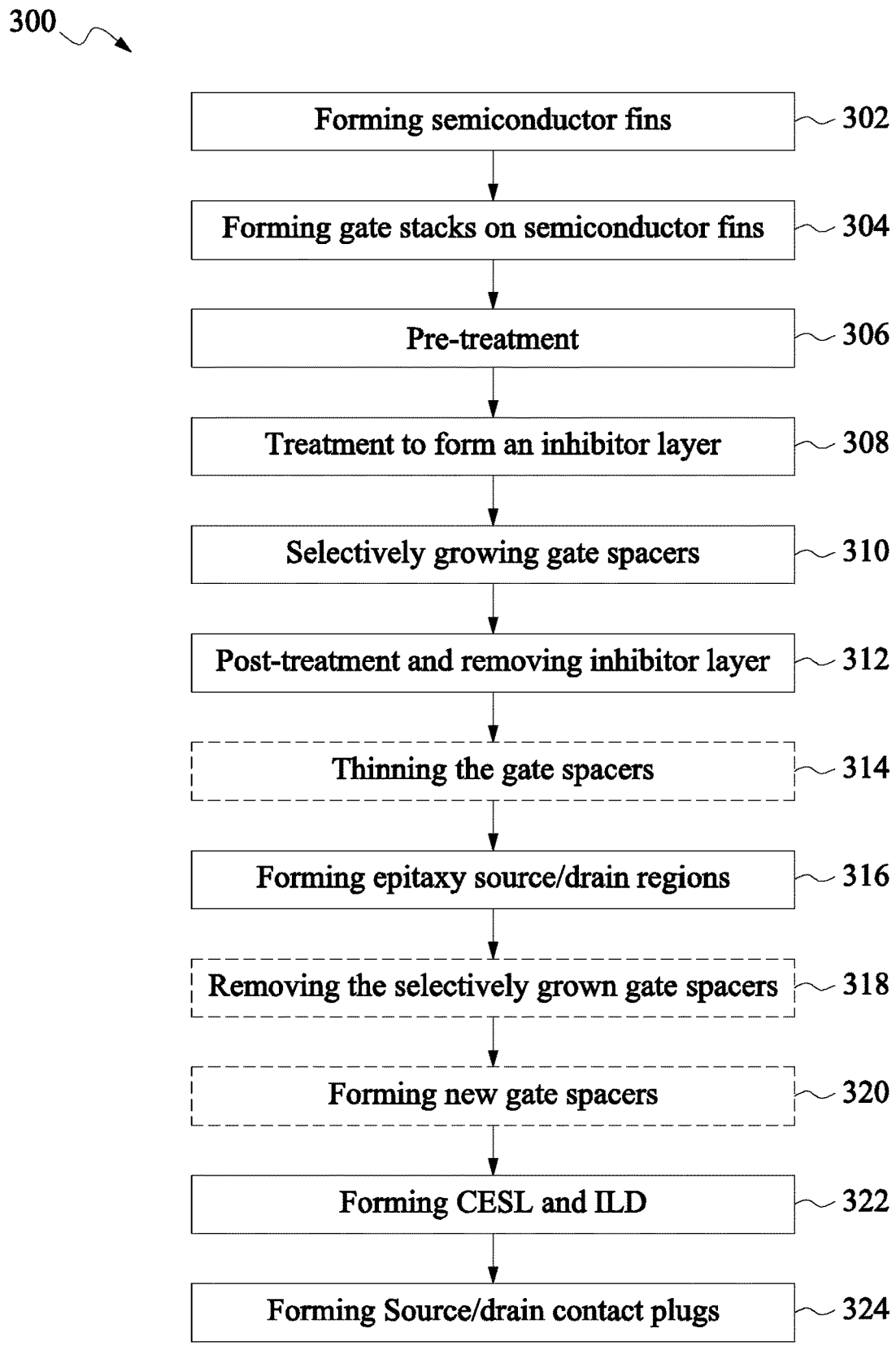
FIG. 21 illustrates a process flow for forming FinFETs in accordance with some embodiments.

FIGS. 1 through 19A, 19B, and 19C illustrate the cross-sectional views and perspective views of intermediate stages in the formation of transistors in accordance with some embodiments of the present disclosure. The steps shown in FIGS. 1 through 19A, 19B, and 19C are also reflected schematically in the process flow 300 shown in FIG. 21.

FIG. 1 illustrates a perspective view of an initial structure for forming a FinFET. The initial structure includes wafer 10, which further includes substrate 20. Substrate 20 may be a semiconductor substrate, which may be a silicon substrate, a silicon germanium substrate, or a substrate formed of other semiconductor materials. Substrate 20 may be doped with a p-type or an n-type impurity. Isolation regions 22 such as Shallow Trench Isolation (STI) regions may be formed to extend from a top surface of substrate 20 into substrate 20. The portions of substrate 20 between neighboring STI regions 22 are referred to as semiconductor strips 24. The top surfaces of semiconductor strips 24 and the top surfaces of STI regions 22 may be substantially level with each other in accordance with some exemplary embodiments. In accordance with some embodiments of the present disclosure, semiconductor strips 24 are parts of the original substrate 20, and hence the material of semiconductor strips 24 is the same as that of substrate 20. In accordance with alternative embodiments of the present disclosure, semiconductor strips 24 are replacement strips formed by etching the portions of substrate 20 between STI regions 22 to form recesses, and performing an epitaxy to regrow another semiconductor material in the recesses. Accordingly, semiconductor strips 24 are formed of a semiconductor material different from that of substrate 20. In accordance with some exemplary embodiments, semiconductor strips 24 are formed of silicon germanium, silicon carbon, or a III-V compound semiconductor material.

STI regions 22 may include a liner oxide (not shown), which may be a thermal oxide formed through thermal oxidation of a surface layer of substrate 20. The liner oxide may also be a deposited silicon oxide layer formed using, for example, Atomic Layer Deposition (ALD), High-Density Plasma Chemical Vapor Deposition (HDPCVD), or Chemical Vapor Deposition (CVD). STI regions 22 also include a dielectric material over the liner oxide, wherein the dielectric material may be formed using Flowable Chemical Vapor Deposition (FCVD), spin-on coating, or the like.

Figure 2:
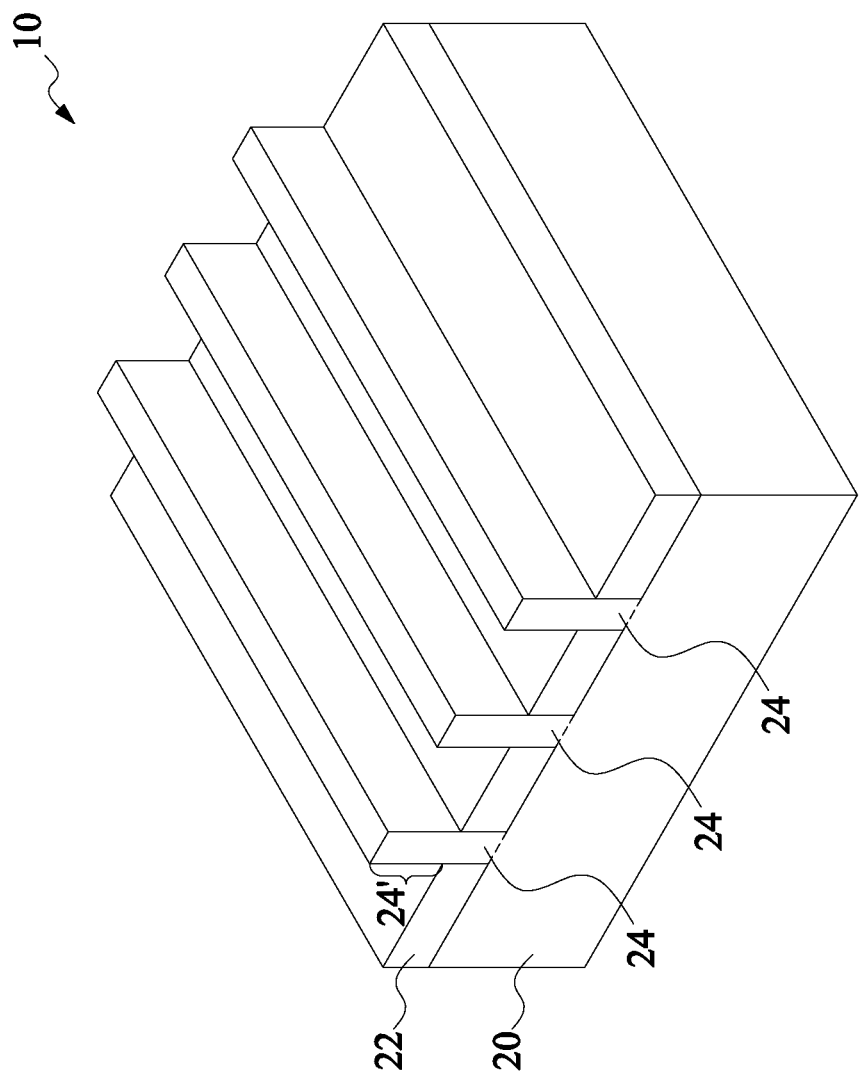

Referring to FIG. 2, STI regions 22 are recessed, so that the top portions of semiconductor strips 24 protrude higher than the top surfaces of STI regions 22 to form protruding fins 24'. The respective step is illustrated as step 302 in the process flow shown in FIG. 21. The etching may be performed using a dry etching process, wherein HF₃ and NH₃ are used as the etching gases. During the etching process, plasma may be generated. Argon may also be included. In accordance with alternative embodiments of the present disclosure, the recessing of STI regions 22 is performed using a wet etch process. The etching chemical may include HF, for example.

Figure 3:
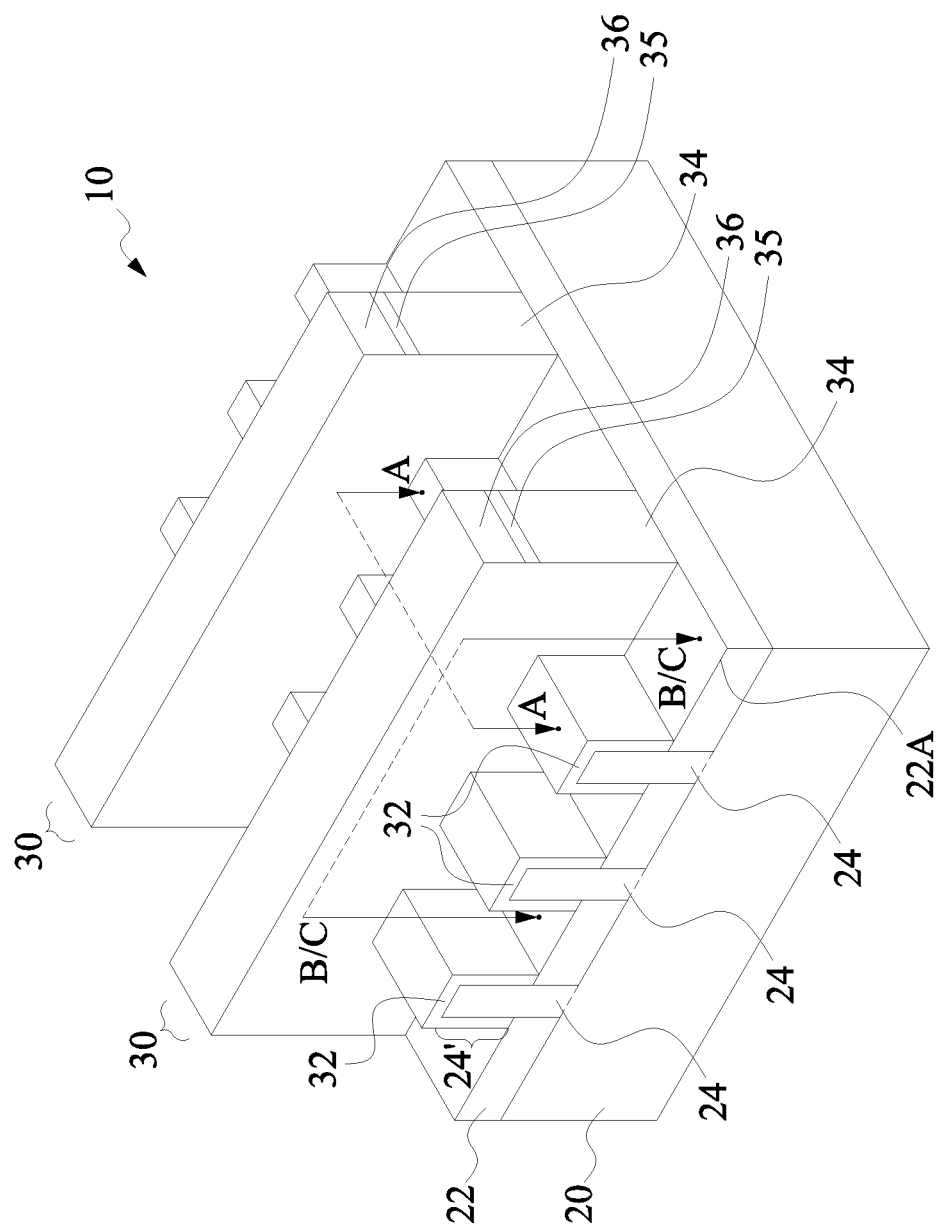

Referring to FIG. 3, dielectric layers 32 are formed on the top surfaces and the sidewalls of protruding fins 24'. Dielectric layers 32 may be oxide layers formed of, for example, silicon oxide. The formation process may include a thermal oxidation process to oxidize the surface layers of protruding fins 24'. In accordance with alternative embodiments, dielectric layers 32 are formed through deposition, for example, using Plasma-Enhanced Chemical Vapor Deposition (PECVD). Gate electrodes 34 are formed on top of dielectric layers 32. In accordance with some embodiments, gate electrodes 34 are formed of polysilicon. Gate electrodes 34 may be the actual gate electrodes of the final FinFETs, or may be dummy gate electrodes that will be replaced with replacement gate electrodes in subsequent steps. Each of dummy gate stacks 30 may also include pad layer 35 and hard mask layer 36 over the respective gate electrodes 34. Pad layer 35 may be formed of an oxide-free dielectric material such as SiCN. Hard mask layer 36 may be formed of an oxide such as silicon oxide. Each of gate electrodes 34, pad layers 35, hard mask layers 36, and the respective underlying parts of dielectric layers 32 are collectively referred to as gate stack 30. The respective formation step is illustrated as step 304 in the process flow shown in FIG. 21. Gate stacks 30 may cross over a single one or a plurality of protruding fins 24' and/or STI regions 22. Gate stacks 30 also have lengthwise directions perpendicular to the lengthwise directions of protruding fins 24'.

The structure shown in FIG. 3 are used as initial structures to continue the formation of FinFETs, as shown in FIGS. 4A, 4B, and 4C through 19A, 19B, and 19C, which illustrate the cross-sectional views of intermediate stages in the formation of FinFETs. A first FinFET is formed in device region 100, and a second FinFET is formed in device region 200, wherein the first FinFET and the second FinFET may both be formed starting from the structure essentially the same as the structure shown in FIG. 3. Each of device regions 100 and 200 is selected from any of a core PMOS region, a core NMOS region, an Input/output (IO) PMOS region, an IO NMOS region, a memory PMOS region, and a memory NMOS region in any combination. In accordance with some exemplary embodiments, device region 100 is a core NMOS region, while device region 200 is a core PMOS region, and vice versa. In accordance with alternative embodiments, device region 100 is an IO NMOS region, while device region 200 is an IO PMOS region, and vice versa.

Furthermore, each of the figure numbers in FIGS. 4A, 4B, and 4C through 19A, 19B, and 19C may include letter "A," "B," or "C," wherein letter "A" indicates that the respective figure illustrates the cross-sectional view of a gate stack 30 in device region 100 and a gate stack 30 in device region 200. The cross-sectional views of gate stacks 30 are also obtained from the vertical plane crossing line A-A in FIG. 3.

Referring to FIG. 4A, the cross-sectional views of gate stacks 30 are illustrated. To distinguish the features in device region 100 from the features in device region 200, the features in device region 100 may be referred to by adding number 100 to the respective reference numbers in FIG. 3, and the features in device region 200 may be referred to by adding number 200 to the respective reference numbers in FIG. 3. Accordingly, in device region 100, gate stack 130 includes dielectric layer 132 on the sidewalls and the top surface of protruding fin 124', gate electrode 134 over dielectric layer 132, pad layer 135, and hard mask 136. In device region 200, gate stack 230 includes dielectric layer 232 on the sidewalls and the top surface of protruding fin 224', gate electrode 234 over dielectric layer 232, pad layer 235, and hard mask 236.

FIG. 4B illustrates that protruding fin 124' is over STI regions 22, and FIG. 4C illustrates that protruding fin 224' is over STI regions 22. Letter "B" in Figure number "4B" indicates that the respective figure is obtained from device region 100, and is obtained from the plane same as the vertical plane containing line B/C-BC in FIG. 4A, and letter "C" in Figure number "4C" indicates that the respective figure is obtained from device region 100, and is obtained from the plane same as the vertical plane containing lines B/C-B/C in FIG. 4A. Accordingly, throughout the drawings of the present disclosure, when a figure number includes letter "B," the figure illustrates the cross-sectional view of protruding fins 124' in device region 100. When a figure number includes letter "C," the figure illustrates the cross-sectional view of protruding fins 224' in device region 200. Also, the cross-sectional views in figures including letter "B" or "C" may also be obtained from the similar vertical plane containing line B/C-B/C in FIG. 3.

Referring to FIGS. 5A, 5B, and 5C, hard mask layers 38 and 40 are formed. Hard mask layers 38 and 40 are formed as conformal layers, and the materials of hard mask layers 38 and 40 are different from each other. In accordance with some embodiments of the present disclosure, hard mask layer 38 is formed of a nitride such as silicon nitride, and hard mask layer 40 is formed of an oxide such as silicon oxide. The formation method may include ALD, CVD, or the like. Further referring to FIGS. 5A and 5B, photo resist 42 is formed and patterned, so that device region 100 is covered by photo resist 42, and device region 200 is not covered, as shown in FIG. 5C.

The portion of hard mask layer 40 in device region 200 is then removed from device region 200, leaving the portion of hard mask 38 in device region 200 exposed. The resulting structure is shown in FIGS. 6B and 6C. Photo resist 42 protects the portion of hard mask layer 40 in device region 100, as shown in FIGS. 6A and 6B. In accordance with some embodiments of the present disclosure, the removal of hard mask layer 40 from device region 200 is performed using wet etch or dry etch. For example, a solution of $H_3PO_4$ may be used in wet etch, and a fluorine-containing gas such as $CF_4/O_2/N_2$, $NF_3/O_2$, $SF_6$ or $SF_6/O_2$ may be used in dry etch.

Figure 7C:
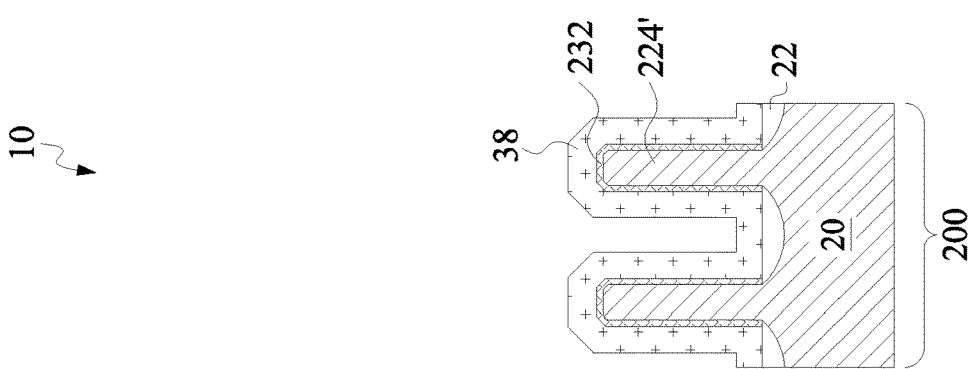
Figure 7A:
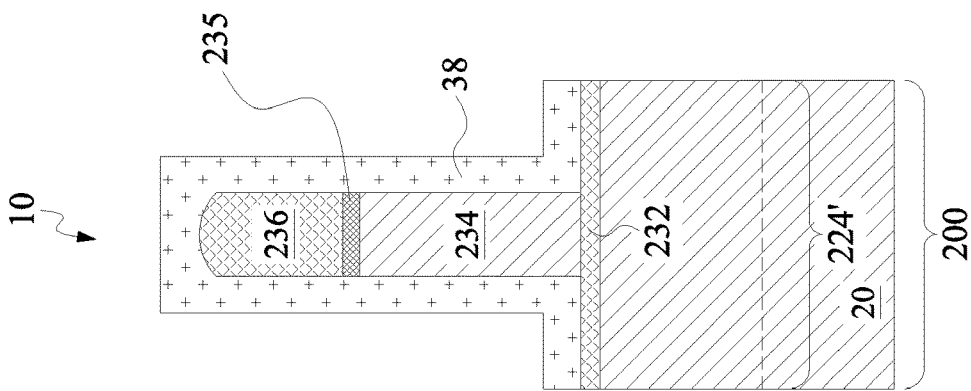
Figure 7B:
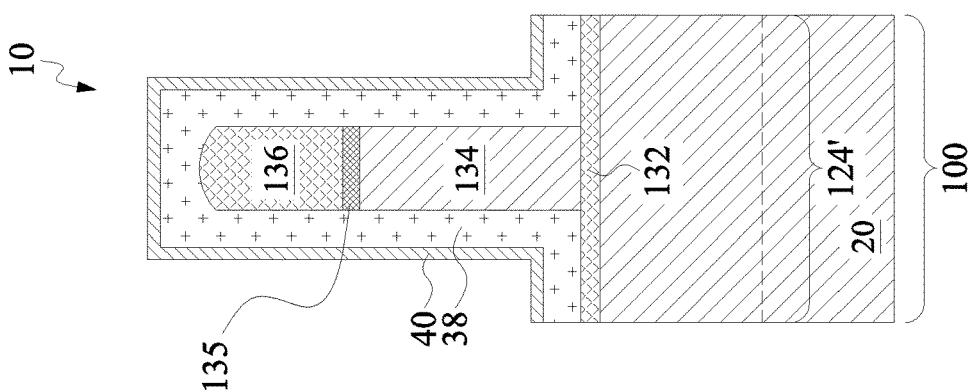

After the removal of hard mask layer 40 from device region 200, photo resist 42 is removed, and the resulting structure is shown in FIGS. 7A, 7B, and 7C. Next, the exposed portion of hard mask layer 40 in device region 200 is removed, and the remaining hard mask layer 40 in device region 100 protects the underlying hard mask layer 38 from being etched. In accordance with some embodiments of the present disclosure, hard mask layer 38 is etched using $H_3PO_4$, or a process gas comprising carbon and fluorine such as $CF_4$. FIGS. 8A, 8B, and 8C illustrate the resulting structure, wherein gate stack 230 is revealed again, and dielectric layer 232 is also exposed. On the other hand, in device region 100, hard mask layer 40 covers the underlying structures.

FIG. 9A illustrates the formation of self-aligned gate spacers 244 in accordance with some embodiments. First, a pre-treatment is performed, for example, using an acid, which may be a diluted hydro fluoride (HF) solution. The pre-treatment may also be performed using a mixed gas of NH₃ (ammonia) and HF₃. The respective step is illustrated as step 306 in the process flow shown in FIG. 21. Next, wafer 10 is further treated in a treatment step, and the dangling bonds generated (during the pre-treatment) on the surface of dielectric layer 232 and hard masks 40 and 236 are terminated to generate inhibitor films 146 and 246. The respective step is illustrated as step 308 in the process flow shown in FIG. 21. For example, the treatment may be performed to generate some hydrophobic bonds with the oxygen atoms in dielectric layer 232, hard mask 236, and hard mask 40. The bonds attached to the oxygen atoms may include C—H bonds, which may include $CH_3$ functional groups. For example, the attached bonds/material may include $Si(CH_3)_3$ in accordance with some embodiments. The process gas may include Bis(trimethylsilyl)amine, hexamethyldisilalane (HMDS), tetramethyldisilazane (TMDS), trimethylchlorosilane (TMCS), dimethyldichlorosilane (DMDCS), methyltrichlorosilane (MTCS), or the like, for example. The respective process for attaching the bonds may include a silylation process. The resulting inhibitor film 246 may be very thin, and may only include some terminating bonds, and hence is illustrated as being dashed. Since the material of dielectric layer 232 is different from that of gate electrode 234, inhibitor film 246 is not on the exposed surfaces of gate electrode 234 and pad layer 235. Accordingly, the property of the surface of 232 is changed to be different form that of gate electrode 234, pad layer 235, and mask layer 40.

Next, self-aligned gate spacers 244 are selectively deposited on the sidewalls of gate electrode 234 and pad layer 235. The respective step is illustrated as step 310 in the process flow shown in FIG. 21. Gate spacers 244 may grow horizontally. Gate spacers 244 are referred to as self-aligned gate spacers since they are self-aligned to the positions of gate electrodes 234. Gate spacers 244 are formed of a dielectric material such as silicon nitride in accordance with some embodiments. The process gas may include a silicon-containing precursor such as $SiBr_4$. The deposition temperature may be in the range between about 450° C. and about 700° C. In accordance with some embodiments of the present disclosure, thickness T1 of gate spacers 244 is greater than about 5 nm, and may be in the range between about 5 nm and about 20 nm.

At the time gate spacers 244 are selectively deposited on the sidewalls of gate electrode 234, no gate spacer 244 is deposited on protruding fins 124' and 224', as shown in FIGS. 9B and 9C since protruding fins 124' and 224' are covered by layers 40 and 232, respectively. This is advantageous comparing to conventional gate spacer formation process. In the conventional gate spacer formation process, a blanket dielectric layer is deposited on both the gate stacks and protruding fins, followed by an etch step to remove the horizontal portions of the blanket dielectric layer. The remaining vertical portions of the blanket dielectric layer are the gate spacers and fins spacers. When the protruding fins are close to each other, however, it is difficult to remove the blanket dielectric layer from the space between the closely located protruding fins. In accordance with the embodiments of the present disclosure, gate spacers 244 are formed selectively on the sidewalls of gate electrode 234, but not between protruding fins 124' and 224', hence eliminating the difficulty in the removal of the blanket dielectric layer from the space between neighboring protruding fins.

After the formation of gate spacers 244, a post-treatment is performed to improve the quality of gate spacers 244. The respective step is illustrated as step 312 in the process flow shown in FIG. 21. In accordance with some exemplary embodiments, the post-treatment is performed through a Rapid Thermal Anneal (RTA) at a temperature between about 800° C. and about 1,200° C. In accordance with alternative embodiments, the post-treatment is performed through plasma treatment, with the process gas comprising $N_2$, $H_2$, Ar, He, and/or the like, for example. The post-treatment removes the dangling bonds of gate spacers 244, and makes gate spacers 244 less porous and more resistant to subsequent cleaning processes.

The post-treatment may result in the removal of inhibitor films 146 and 246. If inhibitor film 246 is not removed as a result of the post-treatment, after the formation of gate spacers 244, and before or after the post-treatment, an additional process is performed to remove inhibitor films 146 and 246. The respective step is also illustrated as step 312 in the process flow shown in FIG. 21. In accordance with some embodiments, inhibitor films 146 and 246 are removed in an etching gas or an etching solution (such as HF), depending on the type of the inhibitor films. In accordance with alternative embodiments, inhibitor film 246 is removed using plasma, which may have slight bombarding effect.

FIGS. 10A, 10B and 10C illustrate the thinning of gate spacers 244 in accordance with some embodiments. The respective step is illustrated as step 314 in the process flow shown in FIG. 21. In accordance with alternative embodiments, gate spacers 244 are not thinned. Throughout the description, some of the steps in process flow 300 (FIG. 21) are shown as dashed to indicate the respective steps may be performed or may be skipped. The thinning may be performed through dry etch, for example. After being thinned, the thickness of gate spacers 244 is reduced to T2, which may be smaller than about 80 percent thickness T1 before the thinning.

Next, hard mask layer 40 and the exposed portions of dielectric layer 232 are removed, and the resulting structure is shown in FIGS. 11A, 11B, and 11C. In accordance with some embodiments, hard mask layer 40 and dielectric layer 232 are formed of a same or similar material, and hence are removed in a same etching process. In accordance with alternative embodiments, hard mask layer 40 and dielectric layer 232 are formed of different materials, and are removed in different etching processes. Protruding fins 224' are thus exposed, as shown in FIGS. 11A and 11C.

FIGS. 12A and 12C illustrate the formation of epitaxy semiconductor regions 250 in accordance with some embodiments. The respective step is illustrated as step 316 in the process flow shown in FIG. 21. Epitaxy regions 250 and protruding fins 242' in combination form source/drain regions 252. In accordance with some exemplary embodiments, epitaxy regions 250 include silicon germanium or silicon. Depending on whether the resulting FinFET is a p-type FinFET or an n-type FinFET, a p-type or an n-type impurity may be in-situ doped with the proceeding of the epitaxy. For example, when the resulting FinFET is a p-type FinFET, silicon germanium boron (SiGeB) may be grown. Conversely, when the resulting FinFET is an n-type FinFET, silicon phosphorous (SiP) or silicon carbon phosphorous (SiCP) may be grown. In accordance with alternative embodiments of the present disclosure, epitaxy regions 250 are formed of a III-V compound semiconductor such as GaAs, InP, GaN, InGaAs, InAlAs, GaSb, AlSb, AlAs, AlP, GaP, combinations thereof, or multi-layers thereof. After epitaxy regions 250 are grown, an implantation step may be performed to increase the doping concentration in source/ drain regions 252. As shown in FIG. 12B, during the epitaxy, no epitaxy regions are formed in device region 100.

In accordance with alternative embodiments, instead of epitaxially growing semiconductor regions on protruding fins 224', the process steps similar to what are shown in FIGS. 15A/15B and 16A/16B are performed to form source and drain regions 252.

Figure 13C:
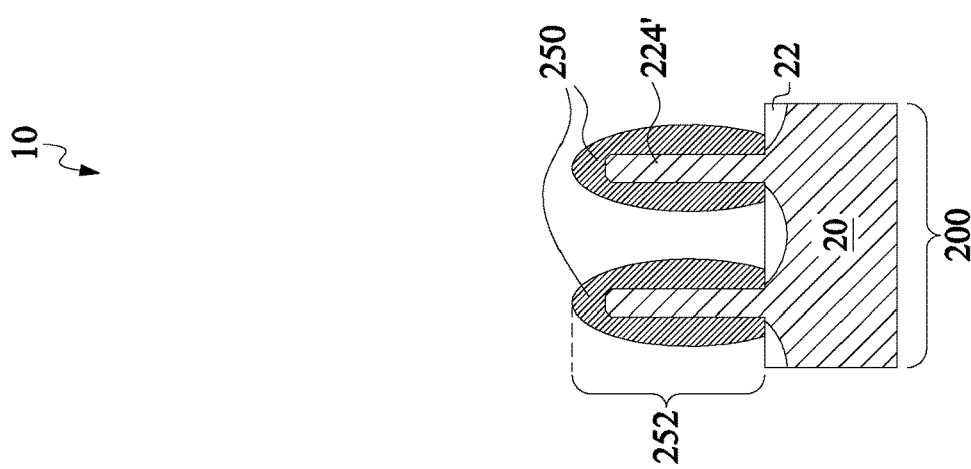
Figure 13A:
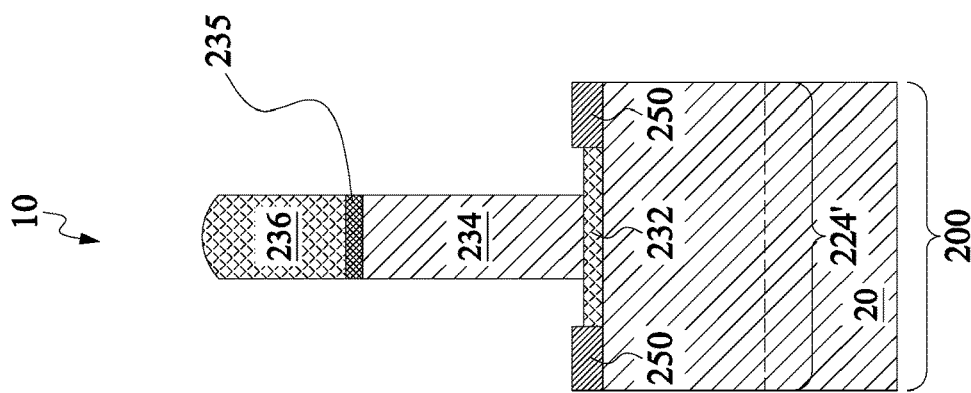
Figure 13B:
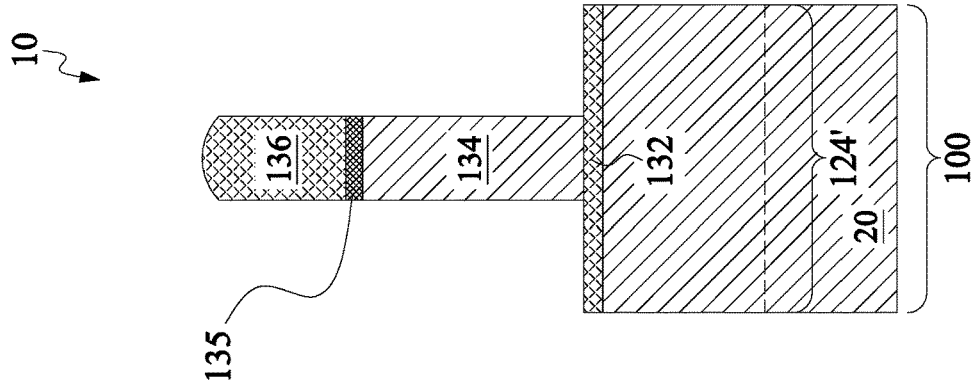

In accordance with some embodiments, gate spacers 244 are removed, and are replaced with new gate spacers. The respective step is illustrated as step 318 in the process flow shown in FIG. 21. In accordance with alternative embodiments, gate spacers 244 remain in the final product. When gate spacers 244 are to be removed, an etching process is performed to etch spacers 244, and the underlying gate dielectric 232 is exposed. The resulting structure is shown in FIGS. 13A, 13B, and 13C.

Next, hard mask 54 is formed as a blanket layer covering both device regions 100 and 200. In accordance with some embodiments, hard mask 54 is formed of silicon nitride. Photo resist 56 is then applied and patterned, so that device region 200 is covered (FIGS. 14A and 14C), and device region 100 is not covered by photo resist 56. Next, an anisotropic etch is performed on hard mask 54 to form gate spacers 156 on the sidewalls of gate stack 130, as also shown in FIG. 14A. The remaining hard mask 54 also forms fin spacers 155 on the sidewalls of protruding fins 124', as shown in FIG. 14B. It is appreciated that since fins 124' are closely located from each other, the space between neighboring fins 124' are difficult to remove, and some horizontal portions of hard mask 54 may remain, as shown in FIG. 14B.

Protruding fins 124' is then etched using gate spacers 156 and fin spacers 155 as an etching mask to form recesses 157, which are shown in FIGS. 15A and 15B. The portion of hard mask 54 in device region 200 is covered by photo resist 56, as shown in FIG. 15C. Photo resist 56 is then removed. In a subsequent step, an epitaxy is performed to grown epitaxy regions 152, which are also the source/drain regions of the FinFET in device region 100. The resulting structure is shown in FIGS. 16A, 16B, and 16C. The material of epitaxy regions 152 is related to whether the respective FinFET is a p-type FinFET or an n-type FinFET, and may include SiGeB, SiP, SiCP, or the like.

Figure 18C:
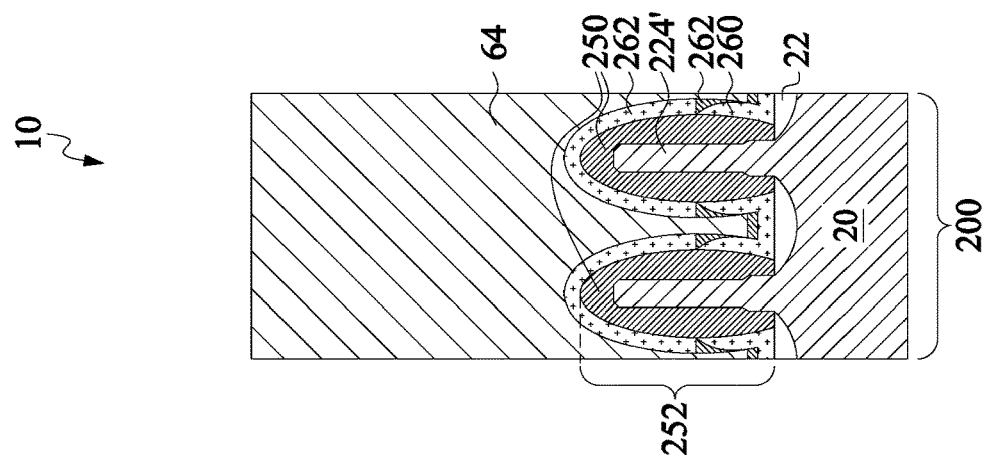
Figure 18A:
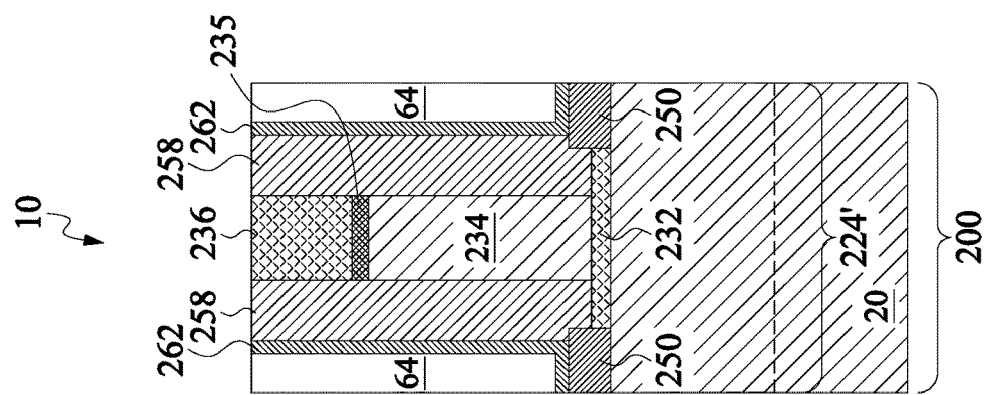
Figure 18A:
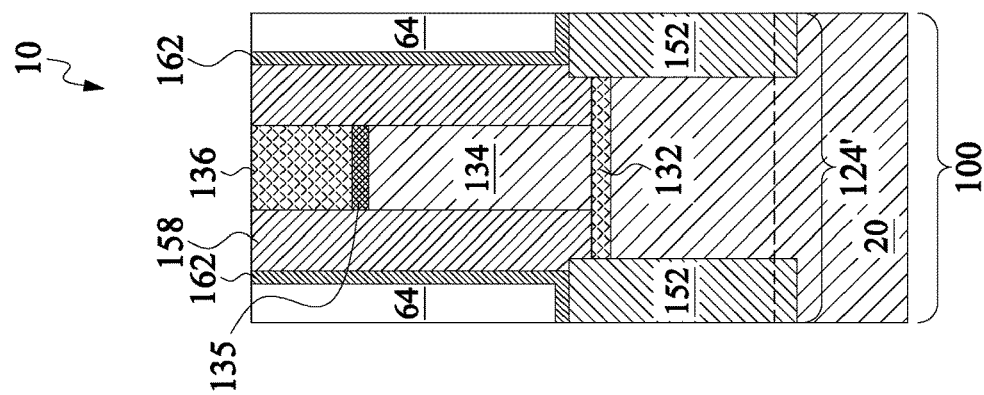
Figure 18B:
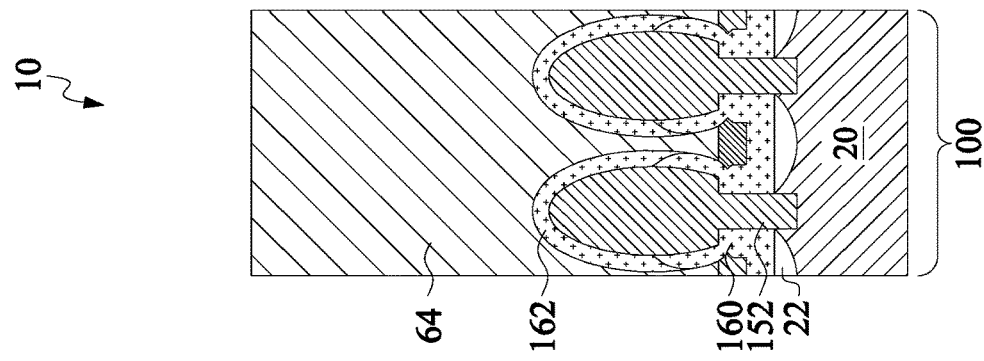

Next, hard mask 54, gate spacers 156, and fin spacers 155 are removed, for example, in isotropic etching processes, resulting in the structure shown in FIGS. 17A, 17B, and 17C, wherein epitaxy regions 152 and 250 are exposed. Referring to FIGS. 18A, 18B, and 18C, gate spacers 158 and 258 are formed on the sidewalls of gate electrodes 134 and 234, respectively. The respective step is illustrated as step 320 in the process flow shown in FIG. 21. Gate spacers 158 and 258 may be formed of a dielectric material selected from the same group of candidate materials for forming gate spacers 244, and may be formed of silicon nitride, for example. Gate spacers 158 and 258 may (or may not) have a thickness greater than the thickness T2 of gate spacers 244 (FIG. 10A). Accordingly, gate spacers 258 may overlap the edge portions of epitaxy regions 250. At the same time gate spacers 158 and 258 are formed, fin spacers 160 and 260 may also be formed by the same deposition and etching process.

Contact Etch Stop Layer (CESL) 162 and 262 are then deposited to cover source/drain regions 152 and 252, respectively. The respective step is illustrated as step 322 in the process flow shown in FIG. 21. CESL 162 and 262 may be formed of silicon oxide, silicon nitride, or the like. Next, Inter-Layer Dielectric (ILD) 64 is formed to cover wafer 10, followed by a planarization such as CMP or mechanical grinding. The respective step is also illustrated as step 322 in the process flow shown in FIG. 21. Hard mask 136 and 236 may be used as a CMP stop layer in the planarization.

Referring to FIGS. 19A, 19B, and 19C, the subsequent process steps may include, for example, removing some portions of hard mask 136 and 236 and pad layers 135 and 235 to form recesses, so that gate electrodes 134 and 234 are exposed through the recesses. A metallic material is then filled into the resulting recesses to form gate contact plugs 166 and 266.

Also, ILD 64 and CESLs 162 and 262 are etched to form source/drain contact openings, and silicide regions 168 and 268 are formed on the exposed source/drain regions 152 and 252, respectively. Source/drain contact plugs 170 and 270 are then formed to electrically connect to source/drain silicide regions 168 and 268, respectively. The respective step is illustrated as step 324 in the process flow shown in FIG. 21. FinFETs 172 and 272 (marked in FIG. 19A) are thus formed. It is also appreciated that the gate electrodes 134 and 234 may be used as the gate electrodes of the final FinFETs, or may be replaced with metal gate electrodes. In accordance with some embodiments in which gate electrodes 134 and 234 are to be replaced, after the formation of CESLs 162 and 262 and ILD 64, the gate stacks including layers 136/236, 135/235, 134/234, and some portions of 132/232 are etched to form recesses in ILD 64, which recesses are between gate spacers 158 and 258. The recesses are then filled with replacement gate stacks.

Figure 20C:
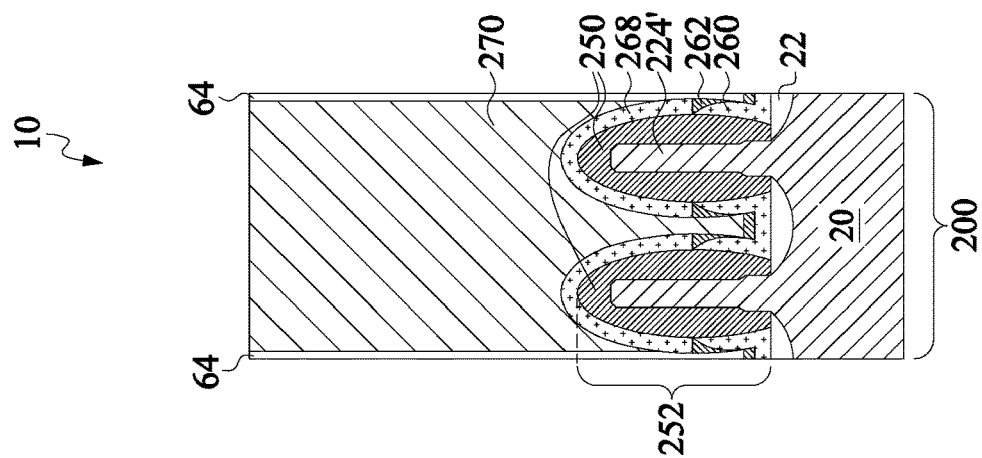
FIGS. 20A, 20B, and 20C are cross-sectional views of FinFETs in accordance with some embodiments.
Figure 20A:
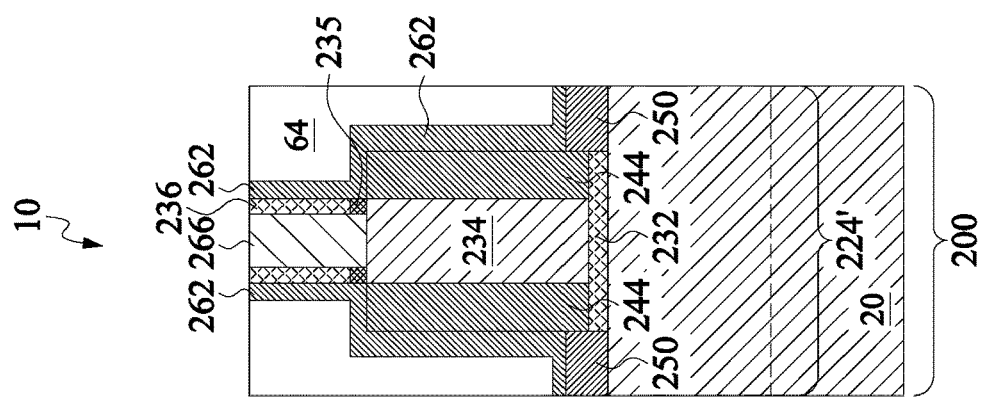
Figure 20A:
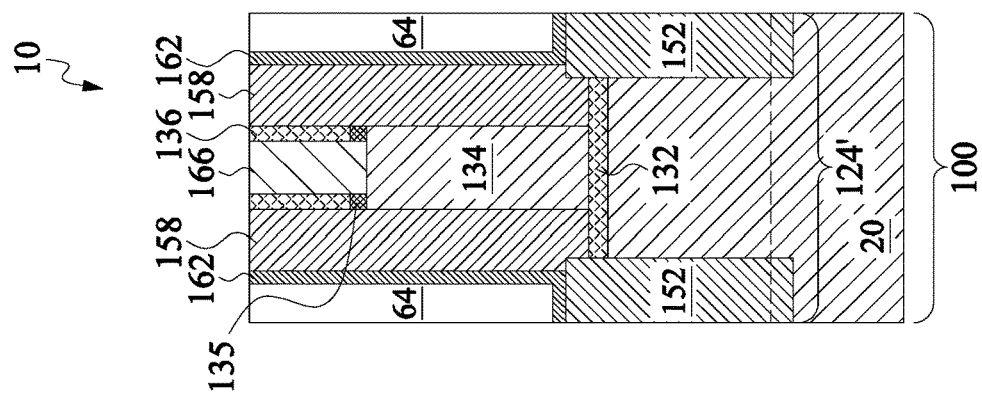
Figure 20B:
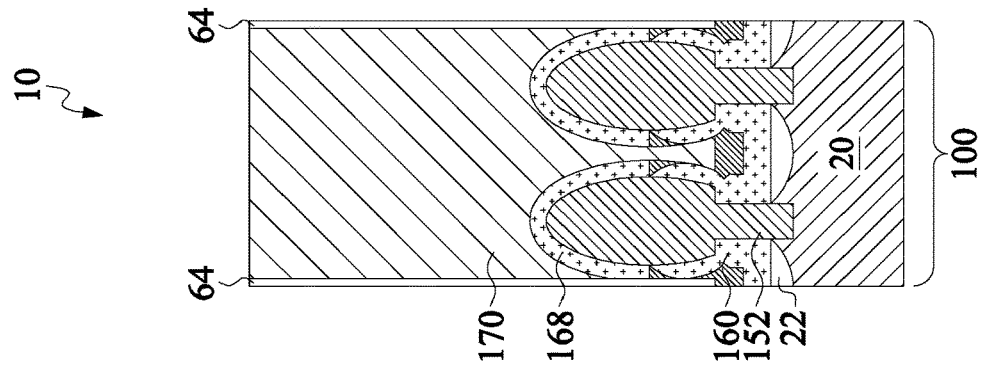

FIGS. 20A, 20B, and 20C illustrate FinFETs 172 and 272 in accordance with alternative embodiments. These embodiments are similar to the embodiments in FIGS. 1 through 19A/19B/19C, except that after the formation of epitaxy region 250 as shown in FIGS. 12A and 12C, gate spacers 244 are not removed. Accordingly, the process steps in accordance with these embodiments include the steps shown in FIGS. 1 through 12A/12B/12C and the steps shown in FIGS. 13A/13B/13C through 19A/19B/19C, wherein the gate spacers 258 as shown in FIG. 19A will not be formed, while gate spacers 244 will be kept.

The embodiments of the present disclosure have some advantageous features. By selectively depositing gate spacers on the sidewalls of gate electrodes, there is no need to form a conformal dielectric layer and anisotropically etching the conformal dielectric layer to form gate spacers. Accordingly, at the time the gate spacers are formed, no fin spacers are formed. The difficulty in reducing or removing fin spacers in convention processes is thus avoided.

In accordance with some embodiments of the present disclosure, a method includes forming a gate dielectric layer on a semiconductor fin, and forming a gate electrode over the gate dielectric layer. The gate electrode extends on sidewalls and a top surface of the semiconductor fin. A gate spacer is selectively deposited on a sidewall of the gate electrode. An exposed portion of the gate dielectric layer is free from a same material for forming the gate spacer deposited thereon. The method further includes etching the gate dielectric layer using the gate spacer as an etching mask to expose a portion of the semiconductor fin, and forming an epitaxy semiconductor region based on the semiconductor fin.

In accordance with some embodiments of the present disclosure, a method includes forming a gate dielectric layer on a semiconductor fin, forming a gate electrode over the gate dielectric layer, performing a pre-treatment on an exposed surface of the gate dielectric layer using an acid, performing a silylation process on the exposed surface of the gate dielectric layer, depositing a gate spacer to contact a sidewall of the gate electrode, etching the gate dielectric layer using the gate spacer as an etching mask to expose a portion of the semiconductor fin, and forming a epitaxy semiconductor region based on the semiconductor fin.

In accordance with some embodiments of the present disclosure, a method includes forming a gate stack over an oxide layer. The gate stack includes a gate electrode, a pad layer over the gate electrode, and an oxide hard mask over the pad layer. The gate stack covers a first portion of the oxide layer, and a second portion of the oxide layer is exposed. A gate spacer is selectively grown on exposed sidewalls of the gate electrode and the pad layer. The second portion of the oxide layer remains exposed after the gate spacer is grown. A source/drain region is formed adjacent to the gate spacer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a gate dielectric layer on a semiconductor fin;
   forming a gate electrode over the gate dielectric layer, wherein the gate electrode covers a first portion of the gate dielectric layer, and a second portion of the gate dielectric layer extends beyond edges of the gate electrode to contact sidewalls of the semiconductor fin;
   forming an inhibitor film on the second portion of the gate dielectric layer;
   growing a gate spacer on a sidewall of the gate electrode, wherein the inhibitor film prevents the gate spacer from growing on the second portion of the gate dielectric layer; and
   removing the inhibitor film.

2. The method of claim 1 further comprising:
   growing an epitaxy semiconductor region aside of the gate spacer, wherein the gate spacer is used as a mask when the epitaxy semiconductor region is grown; and
   after the epitaxy semiconductor region is grown, removing the gate spacer.

3. The method of claim 1, wherein the inhibitor film is selectively formed on the second portion of the gate dielectric layer, with sidewalls of the gate electrode exposed through the inhibitor film after the inhibitor film is formed.

4. The method of claim 1, wherein the forming the inhibitor film comprises performing a treatment on the second portion of the gate dielectric layer and sidewalls of the gate electrode simultaneously.

5. The method of claim 1, wherein the forming the inhibitor film comprises performing a treatment using a process gas selected from the group consisting of Bis (trimethylsilyl)amine, hexamethyldisilazane (HMDS), tetramethyldisilazane (TMDS), trimethylchlorosilane (TMCS), dimethyldichlorosilane (DMDCS), and methyltrichlorosilane (MTCS).

6. The method of claim 1, wherein the forming the inhibitor film further comprises performing a pre-treatment process on the gate dielectric layer using a mixed gas of $NH_3$ (ammonia) and $HF_3$.

7. The method of claim 1, wherein the forming the inhibitor film further comprises performing a pre-treatment process on the gate dielectric layer using a hydro fluoride (HF) solution.

8. The method of claim 1, wherein the inhibitor film is removed through annealing.

9. The method of claim 1, wherein the inhibitor film is hydrophobic.

10. A method comprising:
    forming a gate dielectric layer on a semiconductor fin;
    forming a gate electrode over the gate dielectric layer;
    selectively growing a gate spacer from sidewalls of the gate electrode, wherein portions of the gate dielectric layer on sidewalls of the semiconductor fin are exposed during and after the gate spacer is selectively grown; and
    forming a epitaxy semiconductor region based on the semiconductor fin using the gate spacer as a mask.

11. The method of claim 10, wherein the gate dielectric layer comprises an oxide, and the method further comprises selectively growing an inhibitor film on the oxide, and wherein the inhibitor film inhibits the gate spacer from being grown on the gate dielectric layer.

12. The method of claim 11 further comprising forming an oxide layer to cover an additional gate electrode, wherein the inhibitor film is further grown on the oxide layer.

13. The method of claim 10 further comprising:
    pre-treating the gate dielectric layer using a HF solution or a mixed gas of $NH_3$ and $HF_3$; and
    performing a silylation process to attach a $Si(CH_3)$-containing material to the gate dielectric layer to form an inhibitor film on the gate dielectric layer, wherein in the selectively growing the gate spacer, the inhibitor film prevents a same material of the gate spacer from being grown on the inhibitor film.

14. The method of claim 13, wherein the pre-treating is performed using the mixed gas of $NH_3$ and $HF_3$.

15. The method of claim 10 further comprising forming a hard mask overlapping the gate electrode, with the gate electrode being formed using the hard mask as an etching mask, and the hard mask is free from having the gate spacer grown thereon during the growing the gate spacer.

16. The method of claim 10, wherein the selectively growing the gate spacer comprises selectively growing a silicon nitride layer.

17. A method comprising:
    forming an oxide layer on a surface of a semiconductor fin;
    forming a gate electrode over the oxide layer;
    selectively forming an inhibitor film on the oxide layer, with a sidewall of the gate electrode exposed;
    selectively growing a gate spacer on the exposed sidewall of the gate electrode, wherein the inhibitor film prevents fin spacers to be formed on sidewalls of the semiconductor fin; and
    removing at least an outer portion of the gate spacer.

18. The method of claim 17 further comprising removing the inhibitor film through anneal.

19. The method of claim 17, wherein the growing the gate spacer comprises selectively growing silicon nitride.

20. The method of claim 17, wherein the forming the inhibitor film comprises:

pre-treating the oxide layer using a HF solution or a process gas comprising ammonia and HF$_3$; and after the oxide layer is pre-treated, performing a treatment on the oxide layer using a process comprising C-H bonds.

\* \* \* \* \*